(12) United States Patent
Haji-Valizadeh

(10) Patent No.: US 12,125,127 B2
(45) Date of Patent: Oct. 22, 2024

(54) ADVANCED SIGNAL COMBINATION FOR IMPROVED OVERLAPPING IMAGE CORRECTION

(71) Applicant: CANON MEDICAL SYSTEMS CORPORATION, Otawara (JP)

(72) Inventor: Hassan Haji-Valizadeh, Vernon Hills, IL (US)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 400 days.

(21) Appl. No.: 17/536,533

(22) Filed: Nov. 29, 2021

(65) Prior Publication Data
US 2023/0169704 A1 Jun. 1, 2023

(51) Int. Cl.
*G06K 9/00* (2022.01)
*G01R 33/56* (2006.01)
*G01R 33/565* (2006.01)
*G06T 11/00* (2006.01)

(52) U.S. Cl.
CPC ........ *G06T 11/008* (2013.01); *G01R 33/5601* (2013.01); *G01R 33/56509* (2013.01); *G06T 2207/10088* (2013.01)

(58) Field of Classification Search
CPC .................... G06T 11/008; G06T 2207/10088
See application file for complete search history.

(56) References Cited

U.S. PATENT DOCUMENTS 5,729,140 A * 3/1998 Kruger ............... G01R 33/5676
324/309
5,759,152 A * 6/1998 Felmlee ............. G01R 33/3415
324/309
6,265,874 B1 * 7/2001 McGee ............ G01R 33/56509
324/306

(Continued)

FOREIGN PATENT DOCUMENTS

EP 1148343 A2 * 10/2001 ....... G01R 33/56509
WO WO-2015181091 A2 * 12/2015 ......... G01R 33/4818

OTHER PUBLICATIONS

Recent advances in parallel imaging for MRI, Jesse Hamilton et al., Elsevier, 2017, pp. 71-95 (Year: 2017).*

(Continued)

*Primary Examiner* — Jayesh A Patel
(74) *Attorney, Agent, or Firm* — Oblon, McClelland, Maier & Neustadt, L.L.P.

(57) ABSTRACT

An imaging processing method that acquires first and second overlapping image data sets by performing first and second measurements on an overlapping location at first and second times, wherein the first and second times are different times; determines whether the first and second overlapping image data sets have substantially a same image quality; and generating and outputting, a first weighted overlapping combined image by combining (a) first weighted image data generated by applying a first weight to an overlapping frequency range of the overlapping image data set having a higher image quality and (b) second weighted image data (Continued)

generated by applying a second weight to the overlapping frequency range of the overlapping image data set having a lower image quality, wherein the first weight is larger than the second weight.

20 Claims, 17 Drawing Sheets

(56) References Cited

U.S. PATENT DOCUMENTS

| | | | | |
|---|---|---|---|---|
| 6,307,369 | B1* | 10/2001 | Felmlee | G01R 33/5673 |
| | | | | 324/309 |
| 6,587,598 | B1* | 7/2003 | Devillers | G06T 7/223 |
| | | | | 382/284 |
| 9,710,937 | B2* | 7/2017 | Haung | G06T 11/008 |
| 10,330,764 | B2* | 6/2019 | Bito | G01R 33/56509 |
| 10,466,322 | B2* | 11/2019 | Beck | G01R 33/5615 |
| 2003/0004410 | A1* | 1/2003 | Zhu | G01R 33/5611 |
| | | | | 600/422 |
| 2008/0310696 | A1* | 12/2008 | Hwang | G01R 33/56509 |
| | | | | 382/131 |
| 2009/0238487 | A1* | 9/2009 | Nakagawa | G06V 10/24 |
| | | | | 382/274 |
| 2011/0085722 | A1* | 4/2011 | Feiweier | G01R 33/56518 |
| | | | | 324/309 |
| 2011/0175613 | A1* | 7/2011 | Shigeta | G01R 33/4824 |
| | | | | 324/309 |
| 2014/0225612 | A1* | 8/2014 | Polimeni | G01R 33/4835 |
| | | | | 324/309 |
| 2016/0313431 | A1* | 10/2016 | Beck | G01R 33/56509 |
| 2017/0244895 | A1* | 8/2017 | Zilberman | G06T 7/0002 |
| 2018/0278854 | A1* | 9/2018 | Kottel | G06T 5/94 |

OTHER PUBLICATIONS

Measuring signal-to-noise ratio in partially parallel imaging MRI, Frank L. Goerner et al., 2011, pp. 5049-5057 (Year: 2011).*
Fast Volume Reconstruction From Motion Corrupted Stacks of 2D Slices, Bernhard Kainz et al., IEEE, 2015, pp. 1901-1913 (Year: 2015).*
Automated Image Quality Evaluation of Structured Brain MRI Using an Ensemble of Deep Learning Networks, Sheeba J. Sujit et al., 2019, pp. 1260-1267 (Year: 2019).*
Removal of Local Field Gradient Artifacts in—IMaging, Quin X. Yang et al., 1998, pp. 402-409 (Year: 1998).*

* cited by examiner

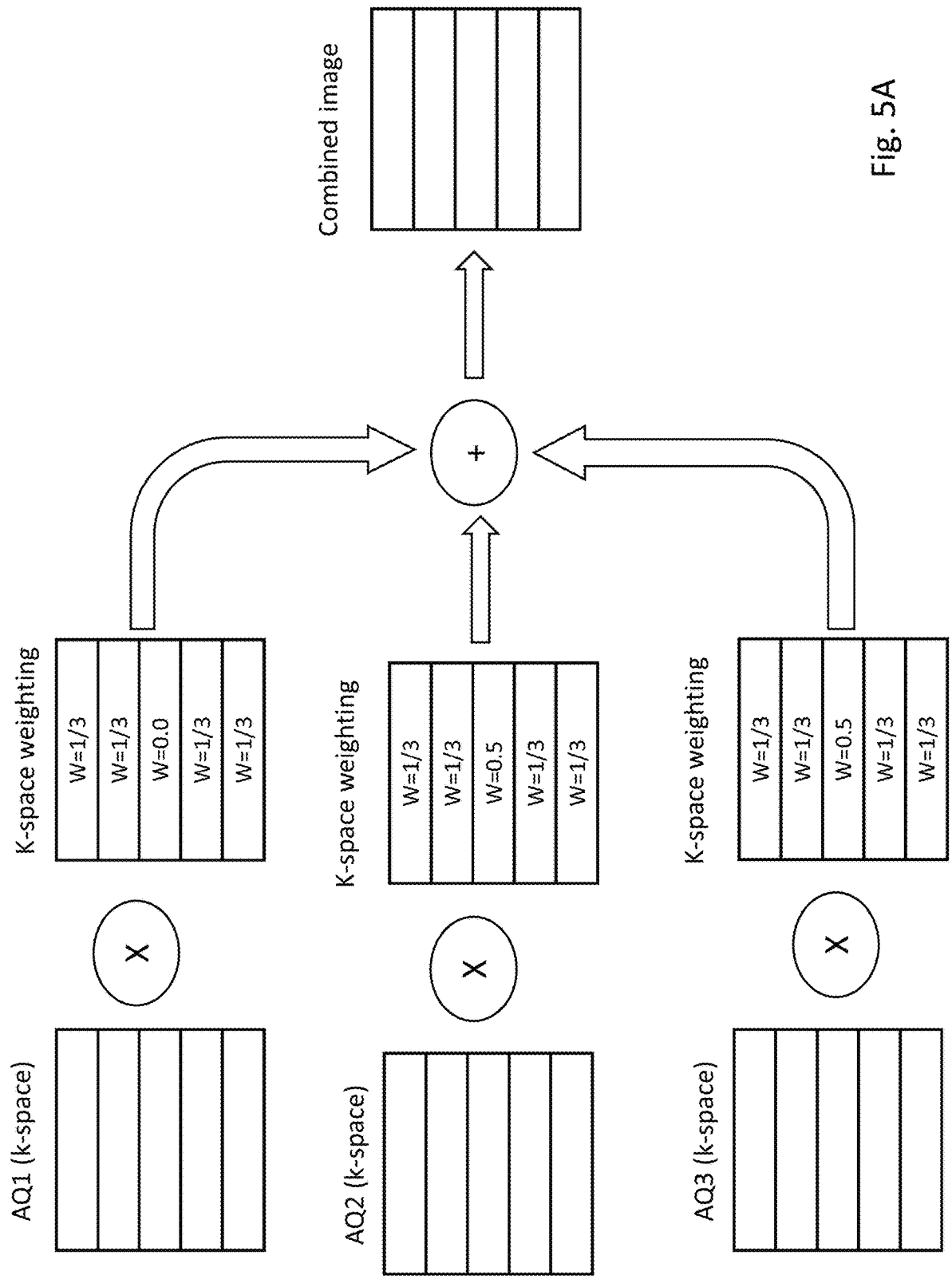

ADVANCED SIGNAL COMBINATION FOR IMPROVED OVERLAPPING IMAGE CORRECTION

BACKGROUND

Motion artifacts are a common problem in medical imaging, such as magnetic resonance imaging (MRI) due, at least in part, to long acquisition times. Typically, T2-weighted cervical spine MRI is acquired with 2 or more overlapping images (often referred to as Number of Acquisitions (NAQ) images) to suppress artifacts and increase signal-to-noise (SNR). Having performed two or more overlapping acquisitions (i.e., having obtained 2 or more overlapping NAQ images), the final image is generated by averaging overlapping NAQ images with equal weighting where the weighting is implemented as a spatially uniform scale factor. FIG. 1 illustrates the result of uniformly combining a first acquired image (AQ1) with a second acquired image (AQ2) overlapping AQ1 when there is no substantial motion in either of the images.

A number of different methods have been proposed to correct for motion artifacts, including, but not limited to utilizing variations of radial FSE ("PROPELLER" in GE, "BLADE" in Siemens, and "JET" in Canon). See, for example, (1) GE PROPELLER 2.0 marketing material, (2) Philips multi-vane XD marketing material, (3) Siemens Blade marketing material. COCOA uses data convolution and combination operations to reduce ghosting artifacts resulting from non-rigid motion. See Huang, F., Lin, W., Börnert, P., Li, Y. and Reykowski, A., 2010. Data convolution and combination operation (COCOA) for motion ghost artifacts reduction. Magnetic resonance in medicine, 64(1), pp. 157-166, the contents of which are incorporated herein by reference.

In addition, navigators correct for in-plane rigid body motion and can also be used for shot rejection. See, for example, (1) Lin, W., Huang, F., Börnert, P., Li, Y. and Reykowski, A., 2010; Motion correction using an enhanced floating navigator and GRAPPA operations; Magnetic Resonance in Medicine: An Official Journal of the International Society for Magnetic Resonance in Medicine, 63(2), pp. 339-348; (2) Kober, T., Marques, J. P., Gruetter, R. and Krueger, G., 2011. Head motion detection using FID navigators. Magnetic resonance in medicine, 66(1), pp. 135-143; and (3) Wallace, T. E., Afacan, O., Waszak, M., Kober, T. and Warfield, S. K., 2019. Head motion measurement and correction using FID navigators. Magnetic resonance in medicine, 81(1), pp. 258-274. The contents of each of those three references are incorporated herein by reference.

Iterative post-processing methods can determine unknown patient motion and correct motion artifact through entropy-related focus criterion. See, for example, Atkinson, D., Hill, D. L., Stoyle, P. N., Summers, P. E., Clare, S., Bowtell, R. and Keevil, S. F., 1999. Automatic compensation of motion artifacts in MRI. Magnetic Resonance in Medicine: An Official Journal of the International Society for Magnetic Resonance in Medicine, 41(1), pp. 163-170, the contents of which are incorporated herein by reference.

Aligned SENSE jointly estimates rigid motion parameters and reconstructs MR images using an iterative reconstruction framework. This iterative framework relies on redundant information provided by multiple coils, as is described in Cordero-Grande, L., Teixeira, R. P. A., Hughes, E. J., Hutter, J., Price, A. N. and Hajnal, J. V., 2016. Sensitivity encoding for aligned multishot magnetic resonance reconstruction. IEEE Transactions on Computational Imaging, 2(3), pp. 266-280, the contents of which are incorporated herein by reference.

Prospective methodologies using cameras enable real-time motion tracking and dynamic updating of acquisition geometry as is described in Siemens has partnered with KinetiCor on a four camera in-bore system.

Alternatively, images with motion can be detected and rejected as described in U.S. Pat. No. 9,710,937 entitled "Local artifact reduction with insignificant side effects."

SUMMARY

Although it is possible combine plural NAQ images using equal weighting when all NAQ images exhibit little motion, such a technique can produce an image with medically non-diagnostic quality if one of the NAQ images contains significantly more motion than others. FIG. 2 illustrates the result of uniformly combining a first acquired image (AQ1) with a second overlapping acquired image (AQ2) when there is substantial motion in the first image. As can be seen from the combined image on the right, the motion (indicated by the arrows in the left-hand image) carries over into the combined image (at the locations indicated by the arrows in the right-hand image).

The present disclosure relates to an imaging apparatus, including, but not limited to: processing circuitry configured to (a) acquire first and second overlapping image data sets by performing first and second measurements on an overlapping location at first and second times, wherein the first and second times are different times; (b) determine whether the first overlapping image data set and the second overlapping image data set have substantially a same image quality; (c) generate and output a uniformly combined image using an equal weighting of the first and second overlapping image data sets when the first and second overlapping image data sets have substantially the same quality; (d) generate and output, when the first overlapping image data set is determined to have a substantially higher image quality than the second overlapping image data set, a first weighted overlapping combined image by combining (a) first weighted image data generated by applying a first weight to an overlapping frequency range of the first overlapping image data set and (b) second weighted image data generated by applying a second weight to the overlapping frequency range of the second overlapping image data set; and (e) generate and output, when the second overlapping image data set is determined to have a substantially higher image quality than the first overlapping image data set, a second weighted overlapping combined image by combining (a) third weighted image data generated by applying the first weight to an overlapping frequency range of the second overlapping image data set and (b) fourth weighted image data generated by applying the second weight to the overlapping frequency range of the first overlapping image data set, wherein the first weight is larger than the second weight.

The present disclosure also relates to a correction method, including, but not limited to: acquiring first and second overlapping image data sets by performing first and second measurements on an overlapping location at first and second times, wherein the first and second times are different times; determining whether the first overlapping image data set and the second overlapping image data set have substantially a same image quality; generating and outputting a uniformly combined image using an equal weighting of the first and second overlapping image data sets when the first and second overlapping image data sets have substantially the same quality; generating and outputting, when the first overlapping image data set is determined to have a substantially higher image quality than the second overlapping image data set, a first weighted overlapping combined image by combining (a) first weighted image data generated by applying a first weight to an overlapping frequency range of the first overlapping image data set and (b) second weighted image data generated by applying a second weight to the overlapping frequency range of the second overlapping image data set; and generating and outputting, when the second overlapping image data set is determined to have a substantially higher image quality than the first overlapping image data set, a second weighted overlapping combined image by combining (a) third weighted image data generated by applying the first weight to an overlapping frequency range of the second overlapping image data set and (b) fourth weighted image data generated by applying the second weight to the overlapping frequency range of the first overlapping image data set, wherein the first weight is larger than the second weight.

The present disclosure also relates to a non-transitory computer-readable storage medium storing computer-readable instructions that, when executed by a computer, cause the computer to perform a method including, but not limited to, acquiring first and second overlapping image data sets by performing first and second measurements on an overlapping location at first and second times, wherein the first and second times are different times; determining whether the first overlapping image data set and the second overlapping image data set have substantially a same image quality; generating and outputting a uniformly combined image using an equal weighting of the first and second overlapping image data sets when the first and second overlapping image data sets have substantially the same quality; generating and outputting, when the first overlapping image data set is determined to have a substantially higher image quality than the second overlapping image data set, a first weighted overlapping combined image by combining (a) first weighted image data generated by applying a first weight to an overlapping frequency range of the first overlapping image data set and (b) second weighted image data generated by applying a second weight to the overlapping frequency range of the second overlapping image data set; and generating and outputting, when the second overlapping image data set is determined to have a substantially higher image quality than the first overlapping image data set, a second weighted overlapping combined image by combining (a) third weighted image data generated by applying the first weight to an overlapping frequency range of the second overlapping image data set and (b) fourth weighted image data generated by applying the second weight to the overlapping frequency range of the first overlapping image data set, wherein the first weight is larger than the second weight.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 5A and 5B are schematic illustrations showing first, second, and third acquired images (AQ1/AQ2/AQ3) being combined according to two different sets of overlapping-image weighting factors to produce respective combined images.

DETAILED DESCRIPTION

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The present disclosure is related to generating a motion corrected image from an imaging process for which an image quality measurement in a plurality of images obtained for the same structure is determined, and the plurality of images are combined based on their corresponding amounts of motion.

In one embodiment, it can be appreciated that the present disclosure can be viewed as a system. While the present exemplary embodiments will refer to an MRI apparatus, it can be appreciated that other system configurations can use other medical imaging apparatuses (e.g. computed tomography apparatus).

Figure 3:
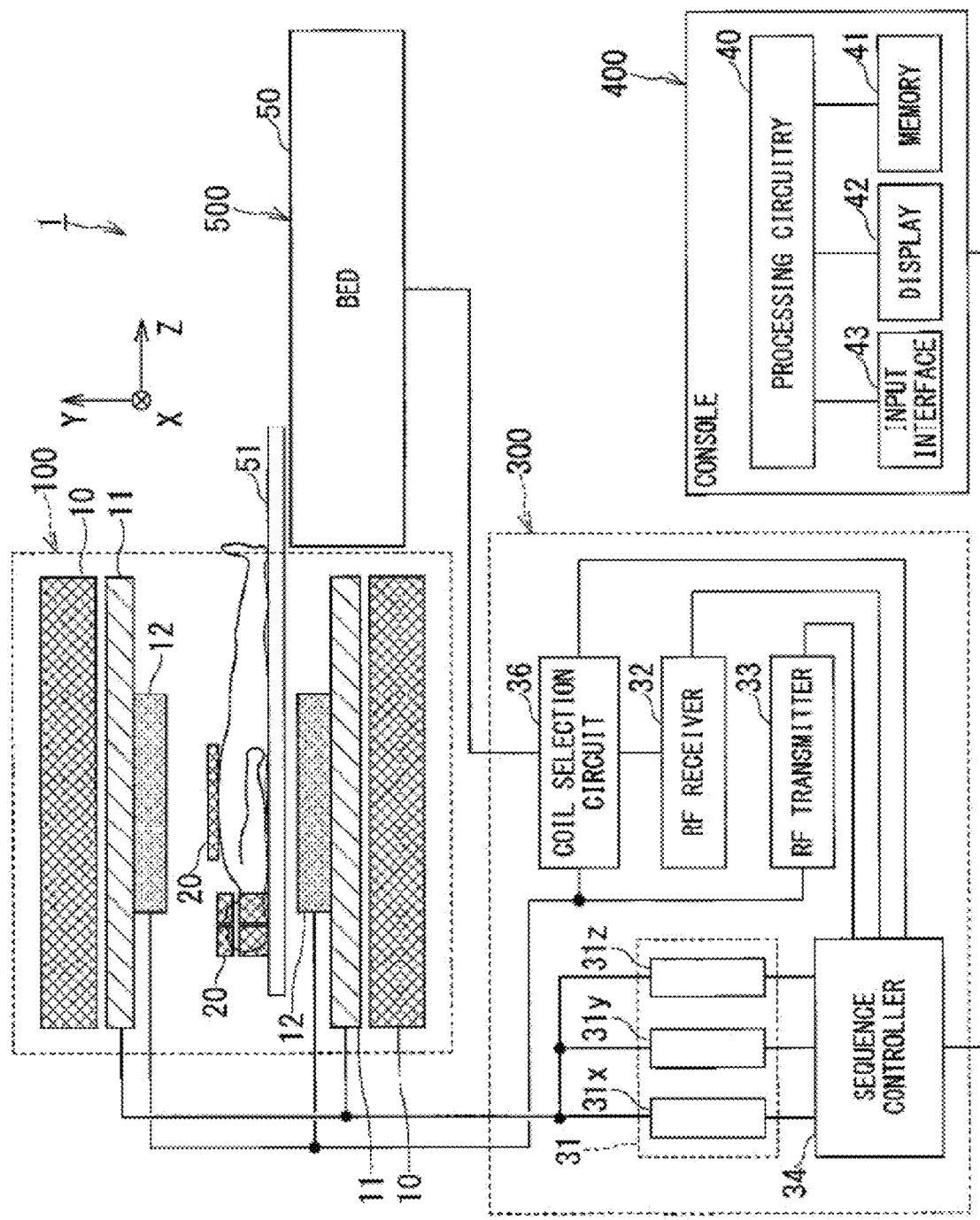
FIG. 3 is a schematic of an MRI apparatus.

Referring now to the drawings, FIG. 3 is a block diagram illustrating overall configuration of an MRI apparatus 1. The MRI apparatus 1 includes a gantry 100, a control cabinet 300, a console 400, a bed 500, and radio frequency (RF) coils 20. The gantry 100, the control cabinet 300, and the bed 500 constitute a scanner, i.e., an imaging unit.

The gantry 100 includes a static magnetic field magnet 10, a gradient coil 11, and a whole body (WB) coil 12, and these components are housed in a cylindrical housing. The bed 500 includes a bed body 50 and a table 51.

The control cabinet 300 includes three gradient coil power supplies 31 (31x for an X-axis, 31y for a Y-axis, and 31z for a Z-axis), a coil selection circuit 36, an RF receiver 32, an RF transmitter 33, and a sequence controller 34.

The console 400 includes processing circuitry 40, a memory 41, a display 42, and an input interface 43. The console 400 functions as a host computer.

The static magnetic field magnet 10 of the gantry 100 is substantially in the form of a cylinder and generates a static magnetic field inside a bore into which an object such as a patient is transported. The bore is a space inside the cylindrical structure of the gantry 100. The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current provided from a static magnetic field power supply (not shown) in an excitation mode. Afterward, the static magnetic field magnet 10 shifts to a permanent current mode, and the static magnetic field power supply is separated. Once it enters the permanent current mode, the static magnetic field magnet 10 continues to generate a strong static magnetic field for a long time, for example, over one year. In FIG. 3, the black circle on the chest of the object indicate the magnetic field center.

The gradient coil 11 is also substantially in the form of a cylinder and is fixed to the inside of the static magnetic field magnet 10. This gradient coil 11 applies gradient magnetic fields (for example, gradient pulses) to the object in the respective directions of the X-axis, the Y-axis, and the Z-axis, by using electric currents supplied from the gradient coil power supplies 31x, 31y, and 31z.

The bed body 50 of the bed 500 can move the table 51 in the vertical direction and in the horizontal direction. The bed body 50 moves the table 51 with an object placed thereon to a predetermined height before imaging. Afterward, when the object is imaged, the bed body 50 moves the table 51 in the horizontal direction so as to move the object to the inside of the bore.

The WB body coil 12 is shaped substantially in the form of a cylinder so as to surround the object and is fixed to the inside of the gradient coil 11. The WB coil 12 applies RF pulses transmitted from the RF transmitter 33 to the object. Further, the WB coil 12 receives magnetic resonance signals, i.e., MR signals emitted from the object due to excitation of hydrogen nuclei.

The MRI apparatus 1 may include the RF coils 20 as shown in FIG. 3 in addition to the WB coil 12. Each of the RF coils 20 is a coil placed close to the body surface of the object. There are various types for the RF coils 20. For example, as the types of the RF coils 20, as shown in FIG. 3, there are a body coil attached to the chest, abdomen, or legs of the object and a spine coil attached to the back side of the object. As another type of the RF coils 20, for example, there is a head coil for imaging the head of the object. Although most of the RF coils 20 are coils dedicated for reception, some of the RF coils 20 such as the head coil are a type that performs both transmission and reception. The RF coils 20 are configured to be attachable to and detachable from the table 51 via a cable.

The RF transmitter 33 generates each RF pulse on the basis of an instruction from the sequence controller 34. The generated RF pulse is transmitted to the WB coil 12 and applied to the object. An MR signal is generated from the object by the application of one or plural RF pulses. Each MR signal is received by the RF coils 20 or the WB coil 12.

The MR signals received by the RF coils 20 are transmitted to the coil selection circuit 36 via cables provided on the table 51 and the bed body 50. The MR signals received by the WB coil 12 are also transmitted to the coil selection circuit 36

The coil selection circuit 36 selects MR signals outputted from each RF coil 20 or MR signals outputted from the WB coil depending on a control signal outputted from the sequence controller 34 or the console 400.

The selected MR signals are outputted to the RF receiver 32. The RF receiver 32 performs analog to digital (AD) conversion on the MR signals, and outputs the converted signals to the sequence controller 34. The digitized MR signals are referred to as raw data in some cases. The AD conversion may be performed inside each RF coil 20 or inside the coil selection circuit 36.

The sequence controller 34 performs a scan of the object by driving the gradient coil power supplies 31, the RF transmitter 33, and the RF receiver 32 under the control of the console 400. When the sequence controller 34 receives raw data from the RF receiver 32 by performing the scan, the sequence controller 34 transmits the received raw data to the console 400.

The sequence controller 34 includes processing circuitry (not shown). This processing circuitry is configured as, for example, a processor for executing predetermined programs or configured as hardware such as a field programmable gate array (FPGA) or an application specific integrated circuit (ASIC).

The console 400 includes the memory 41, the display 42, the input interface 43, and the processing circuitry 40 as described above.

The memory 41 is a recording medium including a read-only memory (ROM) and a random access memory (RAM) in addition to an external memory device such as a hard disk drive (HDD) and an optical disc device. The memory 41 stores various programs executed by a processor of the processing circuitry 40 as well as various types of data and information.

The input interface 43 includes various devices for an operator to input various types of information and data, and is configured of a mouse, a keyboard, a trackball, and/or a touch panel, for example.

The display 42 is a display device such as a liquid crystal display panel, a plasma display panel, and an organic EL panel.

The processing circuitry 40 is a circuit equipped with a central processing unit (CPU) and/or a special-purpose or general-purpose processor, for example. The processor implements various functions described below (e.g. method 800) by executing the programs stored in the memory 41. The processing circuitry 40 may be configured as hardware such as an FPGA and an ASIC. The various functions described below can also be implemented by such hardware. Additionally, the processing circuitry 40 can implement the various functions by combining hardware processing and software processing based on its processor and programs.

Figure 4A:
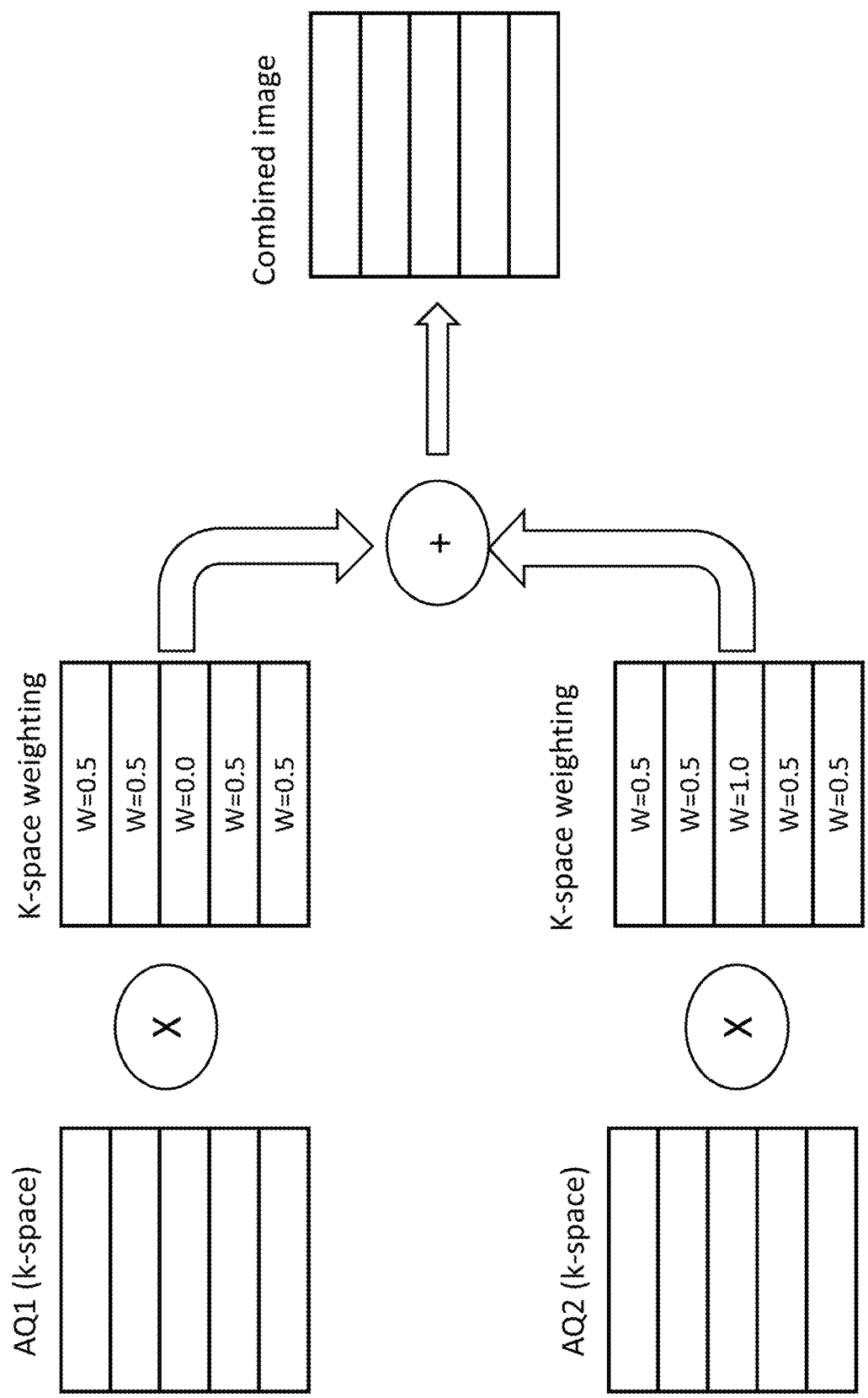
FIGS. 4A and 4B are schematic illustrations showing first and second acquired images (AQ1/AQ2) being combined according to two different sets of overlapping-image weighting factors to produce respective combined images.

As previously mentioned, the present disclosure is related to generating a combined image using overlapping-image weighting factors. FIG. 4A schematically illustrates first and second acquired images (AQ1/AQ2) being combined according to a first set of overlapping-image weighting factors to produce a combined image. In one embodiment of such a system, an image processing apparatus acquires first and second overlapping image data sets (corresponding to AQ1 and AQ2) by performing first and second measurements on an overlapping location at first and second times, wherein the first and second times are different times. The overlapping area need not be the complete image data sets of the first and second overlapping image data sets. For example, in an imaging environment known to have an image sensor that is moving (e.g., moving up or down the patient of the body in a series of scans), the first and second image data sets can be cropped to be just the portions of the data sets that are overlapping before performing the processing described herein.

Figure 1:
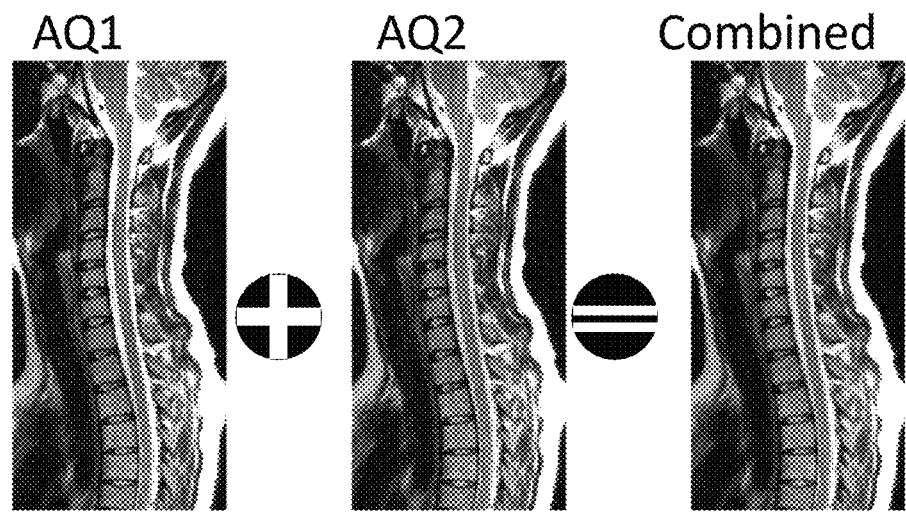
FIG. 1 is a series of images showing how first and second overlapping acquired images (AQ1/AQ2) can be uniformly combined to produce a usable combined image when the first and second images do not include motion.
Figure 2:
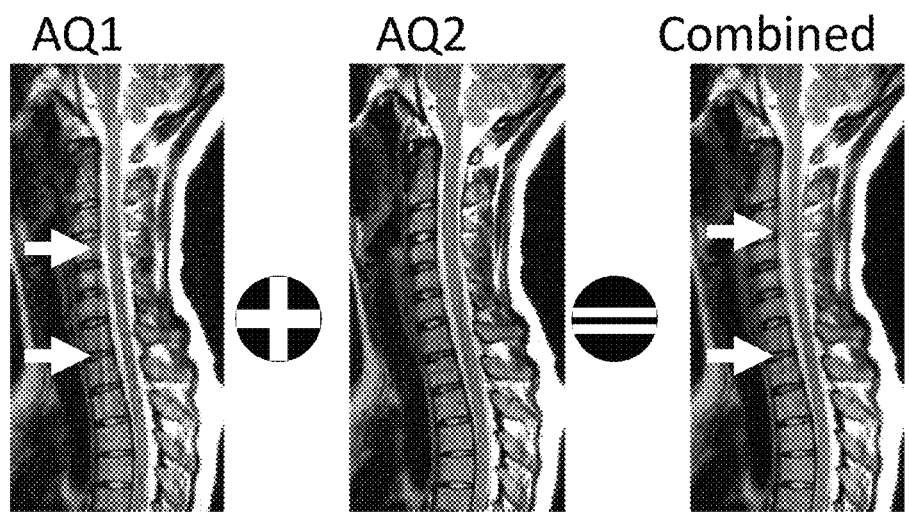
FIG. 2 is a series of images showing how different first and second acquired images (AQ1/AQ2) produce a usable combined image when the first and second images are uniformly combined but include motion.

The first and second overlapping image data sets can be, for example, MRI data sets (e.g., where motion can be present because a patient moved because of breathing, sneezing, or coughing). Overlapping image data sets additionally can correspond to any source that is sensitive to image quality changes (e.g., due to motion) between image acquisitions of the same area. For example, other overlapping image data set sources include, but are not limited to: low dose CT scan data sets, images captured by a camera in quick succession, spectral-domain optical coherence tomography data sets, and ultrasound data sets use image averaging to improve SNR. In the medical field, the first and second data sets typically will be part of a same series of images used to diagnosis a particular area in a patient. As shown in FIG. 2, one such area is the spinal cord area near a head of a patient.

The imaging apparatus is configured to then determine a first image quality measurement in the first overlapping image data set and a second image quality measurement in the second overlapping image data set. The calculation of the image quality measurement in each can be performed in any order and may be performed sequentially or in parallel. When the image apparatus determines that there is a significant difference in the first and second image quality measurements, the apparatus outputs an overlapping-image combination of at least portions of the first and second data sets as a final weighted overlapping combined image. In one embodiment, "significant difference" is measured by an Energy of Edge Difference above a particular threshold (e.g., a percentage difference of at least 10%). Alternative methods for determining similarity (e.g., normalized mean root squared error (NMSRE), structural similarity index measure (SSIM), and image entropy comparison) may require different cut-offs/thresholds for percentage differences and/or absolute cut-offs/thresholds to detect significant difference. In general, a threshold for a "significant difference" can be determined by comparing pairs of classification/training images by a group of domain experts and determining the average value at which the group considers the images to be different for the domain-specific analysis issue.

The combination of the first and second data sets need not be a combination using the same combination parameters across the whole data sets. Instead, first and second portions of the data sets (e.g., a first portion corresponding to a first frequency range and a second portion corresponding to a second frequency range different than the first frequency range) may be combined differently.

For example, the apparatus can be configured to combine, to produce a weighted overlapping combined image, the first and second overlapping image data sets using a first weight based on the first image quality measurement and a second weight based on the second image quality measurement, wherein the first weight is smaller than the second weight when the first image quality measurement is smaller (lower) than the second image quality measurement, and the first weight is larger than the second weight when the first image quality measurement is larger (higher) than the second image quality measurement. As an exemplary processing shown in FIG. 4, the first data set corresponding to AQ1 has a significantly lower quality than the second data set. Accordingly, when generating the final weighted overlapping combined image, the first weight associated with the first image quality measurement is selected to reduce the effect of the first data set on the combined image. Conversely, the second weight associated with the second image quality measurement is selected to increase the effect of the second data set on the combined image. For illustrative purposes, the first and second weights are chosen to be 0.0 and 1.0, respectively, although other weights (e.g., 20% and 80%) are possible that reduce the effect of the lower quality data set on the combined image.

Figure 4B:
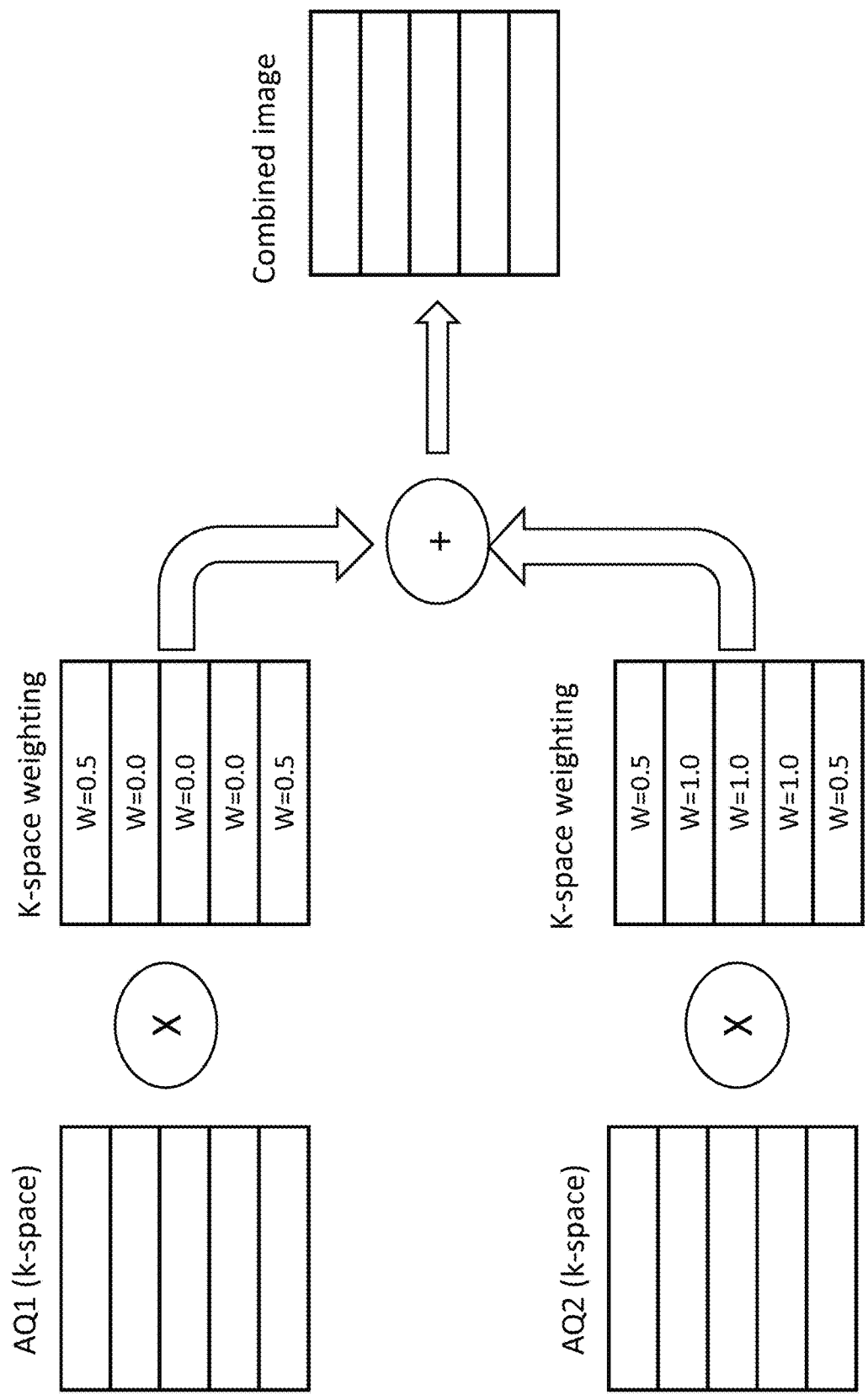

As shown in FIG. 4, different overlapping-image weights can be applied to different portions of the data set. As shown therein, the data sets have been split into n different bands (e.g., 5 different frequency bands), and the weights applied in each of the n bands can be applied independently. Alternatively, the data sets can be split into only two logical bands (e.g., a first band to which non-uniform weights are applied and a second band to which uniform weights are applied). In the illustrated MRI-based embodiment, the non-uniform overlapping-image weighting effectively is applied to the central portion of k-space phase encoding lines (PE) whereas uniform weighting is applied outside the central band in k-space. As a result, the method still removes a majority of the image quality issues (e.g., motion artifacts) and maintains a good signal-to-noise ratio (SNR). The central band is illustrated as the center 20%, but other differently sized bands can be used similarly (e.g., the center 10%-35%). For example, as shown in FIG. 4B, a center 60% is used. In general, overall weighting between images can be controlled by changing the central band size instead of or in addition to how a central range is weighted. Reducing the central band size improves SNR but comes at the cost of more motion artifacts from the image with more motion. Increasing the central band size reduces motion artifacts from the image with more motion but comes at the cost of reduce SNR.

Figure 5B:
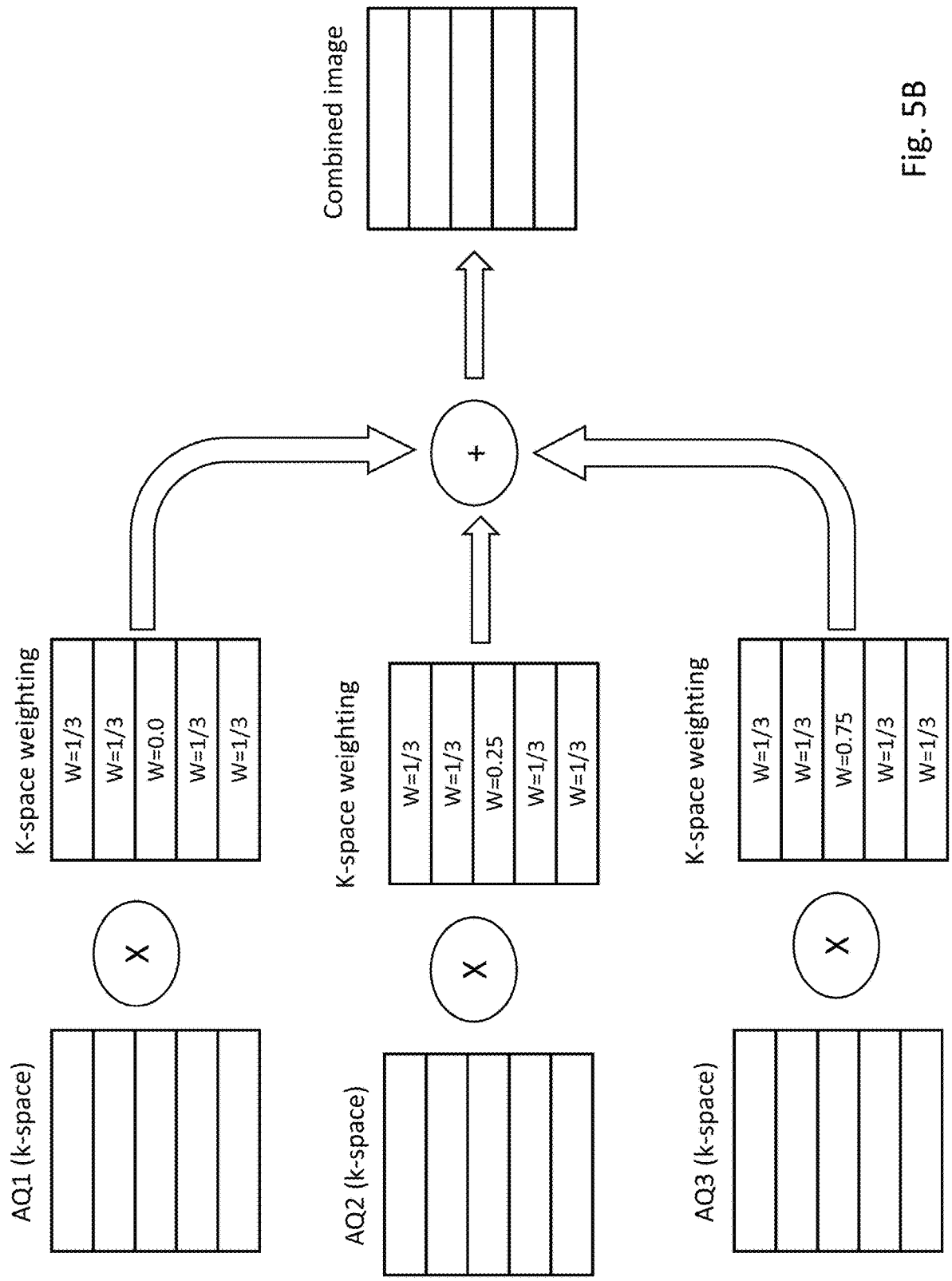

FIG. 5A similarly schematically illustrates first, second, and third acquired images (AQ1/AQ2/AQ3) being combined according to a first set of overlapping-image weighting factors to produce a combined image. The resulting final weighted overlapping combined image when AQ1 has substantially lower quality than AQ2 and AQ3 is produced from a k-space weighting where the central bands of AQ2 and AQ3 are combined uniformly (i.e., each has a weighting of one-half or 0.5 as noted by $W_{AQ1}=0.0$, $W_{AQ2}=0.5$, and $W_{AQ3}=0.5$) but without any contribution from AQ1 (which has a weighting of zero), and the remainder of the k-space is combined uniformly between AQ1, AQ2, and AQ3 (i.e., each has a weighting of one-third). Alternatively, other weightings are possible such as is shown in FIG. 5B where $W_{AQ1}=0.0$, $W_{AQ2}=0.25$, and $W_{AQ3}=0.75$) in a case in which AQ2 and AQ3 have less motion artifacts than AQ1, and AQ3 has less motion artifacts than AQ2. Similarly, some contribution of the central region may be selected from each of the images (e.g., $W_{AQ1}=0.1$, $W_{AQ2}=0.45$, and $W_{AQ3}=0.45$).

Figure 6D:
FIG. 6D is an image produced by applying overlapping-image weightings to the k-space data (frequency space data) corresponding to the first and second acquired images of FIGS. 6A and 6B.
Figure 6C:
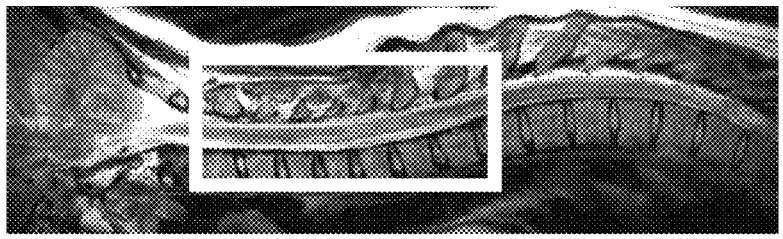
FIG. 6C is an image produced by uniformly combining the first and second acquired images of FIGS. 6A and 6B.
Figure 6B:
FIGS. 6A and 6B are exemplary first and second acquired images of a portion of a spinal cord area near the head.
Figure 6A:
Figures 7A, 7B, 7C, 7D:
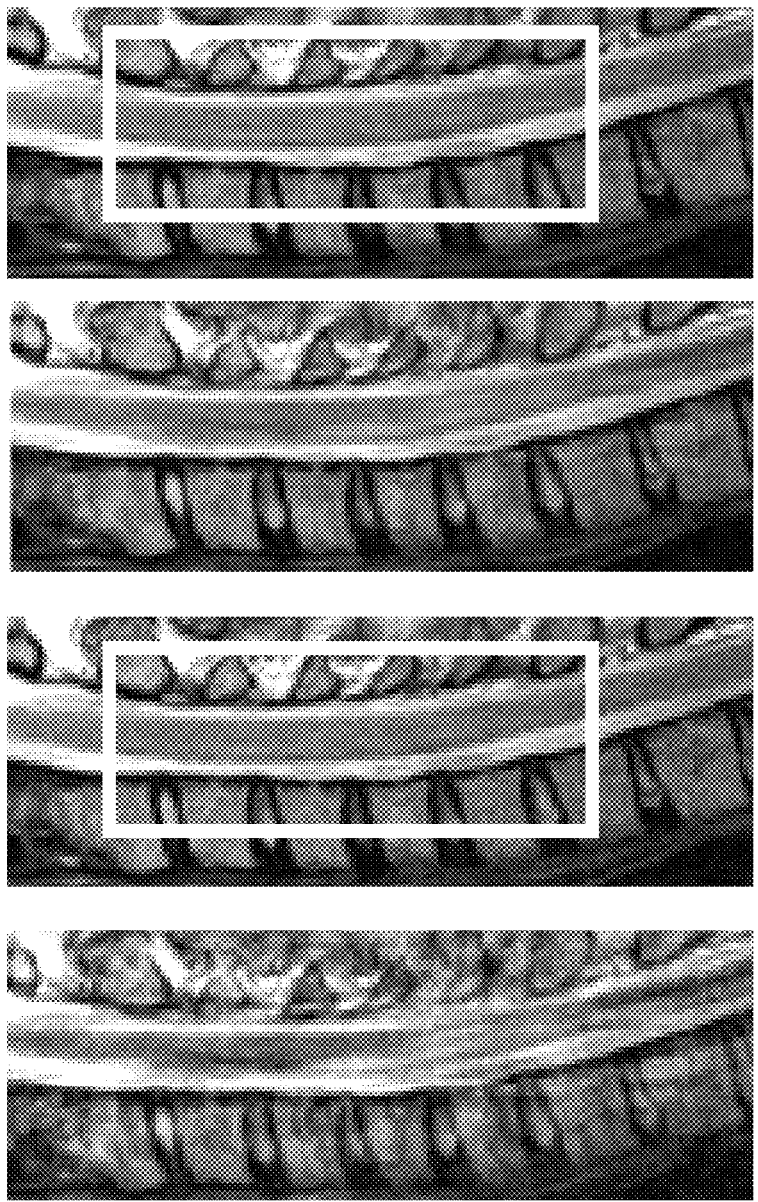
FIGS. 7A-7D are enlarged images corresponding to portions of FIGS. 6A-6D.

FIGS. 6A and 6B illustrate exemplary first and second acquired images of a portion of a spinal cord area near the head, and FIG. 6A includes simulated rigid body motion. FIG. 6D is an image produced by applying the overlapping-image weightings of FIG. 4A to the k-space data corresponding to the first and second acquired images of FIGS. 6A and 6B. As compared with FIG. 6C (which was combined using uniform weighting), FIG. 6D provides a higher quality image. Additional details of the images of FIGS. 6A-6D can be seen in the enlarged versions shown in FIGS. 7A-7D.

Figure 8A:
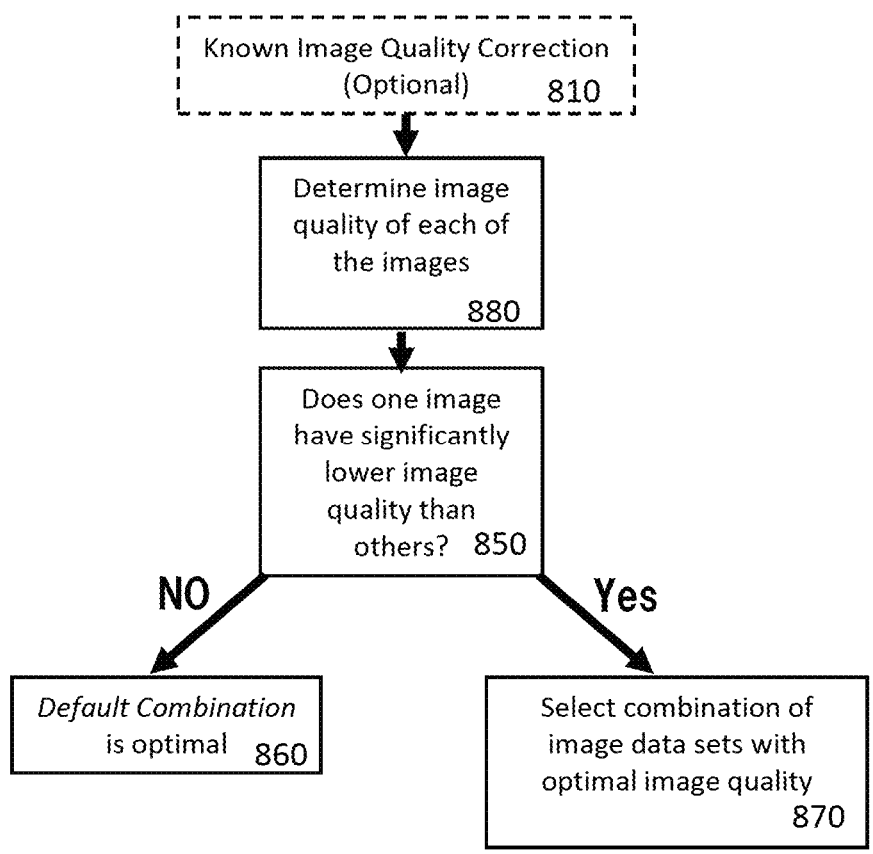
FIG. 8A is a generalized flowchart showing a method of processing overlapping image data sets according to one aspect of the disclosure.

FIG. 8A is a flowchart showing a method of processing overlapping image data sets according to one aspect of the disclosure. Once at least first and second overlapping image data sets are acquired (although more data sets can be acquired), a method or apparatus as described herein can perform the processing steps shown in the flowchart representing method 800. In step 810, before any overlapping-image weighted processing is performed, known image correction techniques (e.g., one or more motion correction techniques, motion registration, and image denoising techniques) optionally can be applied as an initial correction to improve the image quality of the first and second data sets. In step 880, the method determines the image quality of each of the image data sets. In step 850, the method determines if one of the images has significantly lower image quality than the others. If no image data set has significantly lower image quality than the others, then the method transfers control to step 860 which selects the default combination of image data sets as the optimal data set (or image). If step 850 determines that a data set has significantly lower image quality than the others, then the method transfers control from step 850 to step 870 where the optimal combination of images is selected to be the resulting image.

Figure 8B:
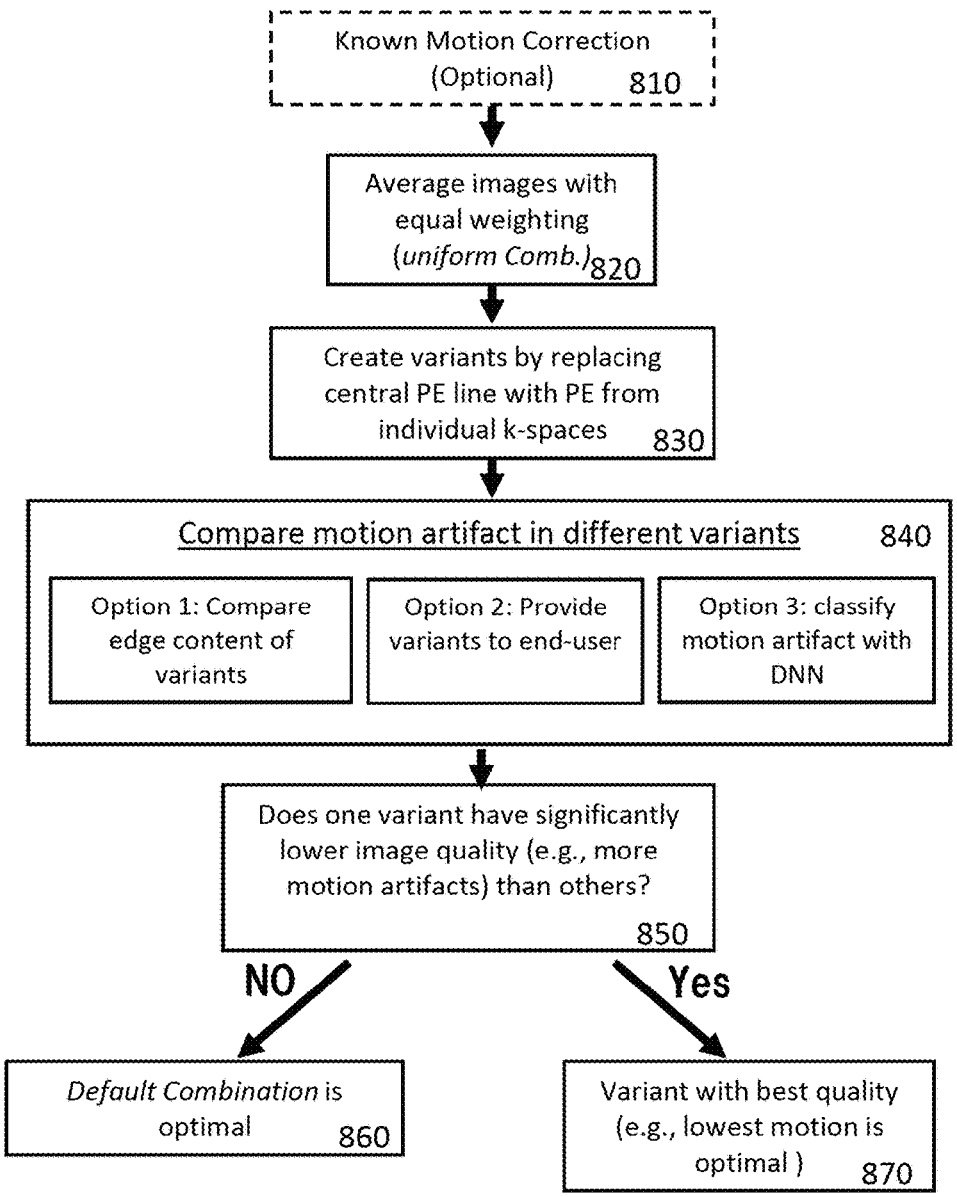
FIG. 8B is a flowchart showing a method of processing overlapping image data sets when correcting for motion artifacts (as opposed to general image quality) in FIG. 8A.

In addition to the details described above with respect to the general method 800 in FIG. 8A, FIG. 8B shows one implementation of a more specific method 800' where the image quality of each of the image data sets is determined by comparing modified versions of the various image data sets with a combined image using the default combination. In such a configuration, step 880 of FIG. 8A is replaced by steps 820, 830, and 840 in FIG. 8B. In step 820, a uniform combination is applied to at least the first and second acquired data sets with equal weighting to produce an initial, uniform image.

In step 830, a portion (e.g., the central 20%) of the phase encoding (PE) lines in k-space in the initial uniform image are replaced with the center of individual acquired k-spaces to create different variants. The number of total variants created can equal up to the number of NAQs acquired since each individual image can be used to replace the portion of the PE lines in the initial uniform image.

In step 840, the method determines if there is significantly lower quality in any variant. While any technique can be used to determine if there is significantly lower quality in any variant, three different options are disclosed below. The first option is an algorithmic comparison. In one embodiment of the comparison, edge content differences between variants are compared to determine if one variant has significantly more detectable edges thereby indicating significantly lower quality than others. The relative amount of edge can be determined using an Energy of Edge difference calculation. Instead of using an edge content difference, other techniques can be used instead, such as normalized mean root squared error (NMSRE), structural similarity index measure (SSIM), image entropy comparison, and mean absolute error (MAE).

A second option is a manual option in which all variants and the default uniform NAQ combination are presented to an end-user, giving the end-user the option to evaluate the image quality of all images.

The third option is to use at least one deep neural network (DNN) to evaluate artifacts in different variants and to determine if any of the variants has significantly more artifacts than others. Alternatively, the images can be analyzed directly by a DNN instead of analyzing the variants.

If no significant differences in motion artifacts is detected in step 850, then a default, uniform NAQ combined image is outputted in step 860. Otherwise, if significant differences in motion artifacts is detected, then variant with lowest level of motion is output in step 870. However, if both images (in the case of two NAQ image) or several of the image (in the case of 3+ NAQ images) exhibit significant motion (or other error), then the system can propose a rescan be performed to decrease the detected motion/error instead of progressing with the remaining steps of the method.

Figure 9:
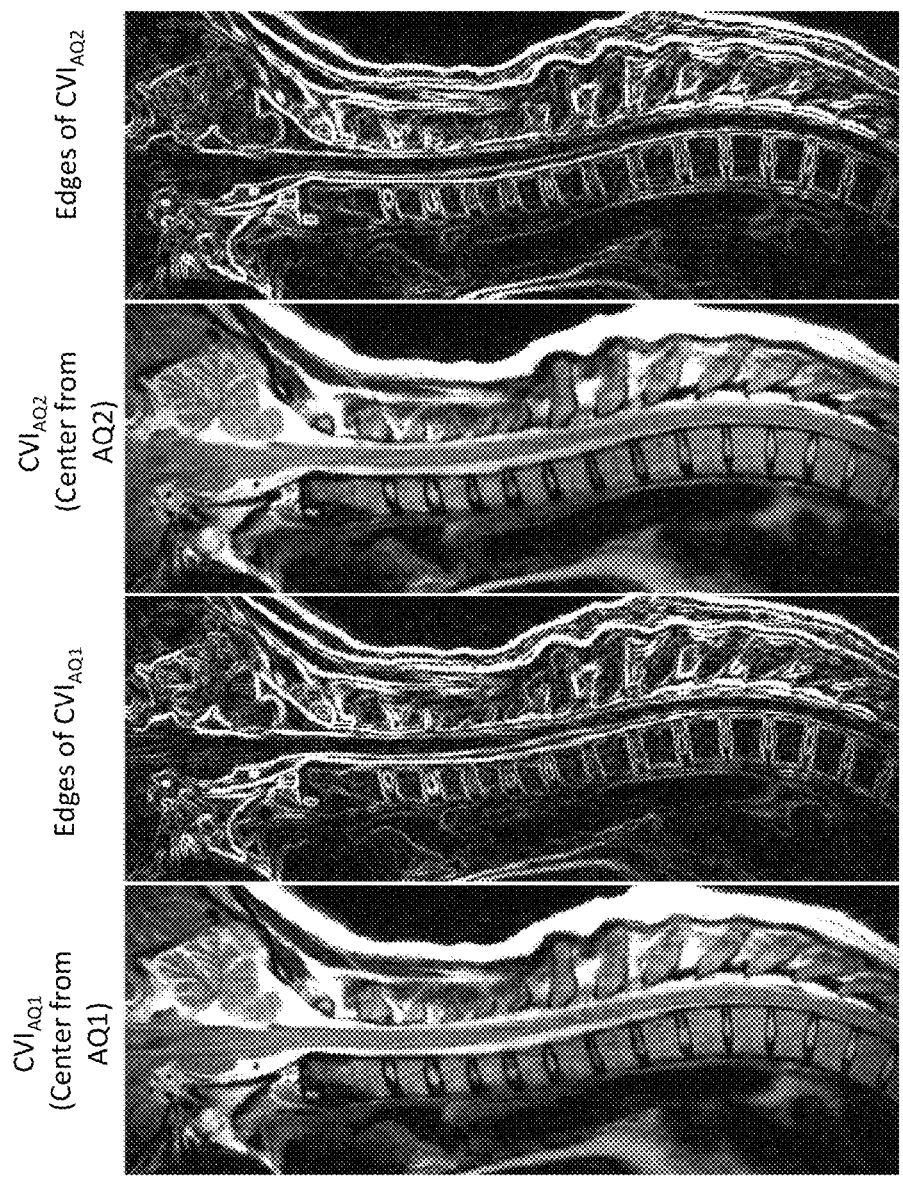
FIG. 9 is a first series of images showing a result of using the center portions of k-space representations of AQ1 and AQ2 separately to generate respective combined variant images and their resulting calculated edges as part of an Energy of Edge Difference (EED) calculation.

FIG. 9 is a first series of images corresponding to one implementation of the first option. In FIG. 9, combined variant images labeled $CVI_{AQ1}$ and $CVI_{AQ2}$, respectively, are shown illustrating an exemplary result of using the center portions of AQ1 and AQ2 separately to generate respective combined images (which are the left-most image and the image second from right, respectively) as described above with respect to step 830. Those images can then be used as part of an Energy of Edge Difference (EED) calculation to determine if the variants have a significant amount of difference between them.

Figure 10:
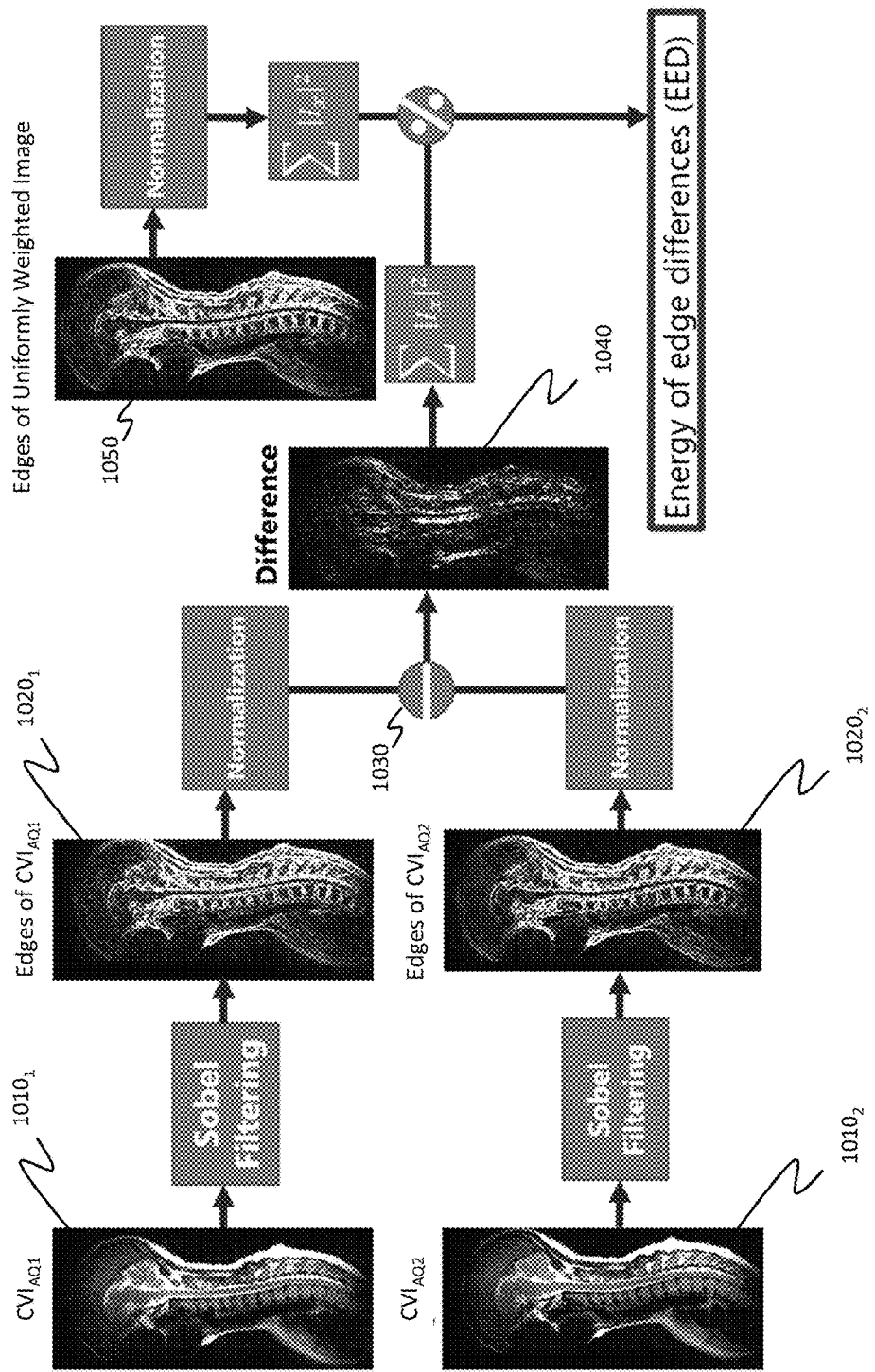
FIG. 10 is an illustration showing the processing flow performed on a series of overlapping images to determine if there is a substantial amount of image quality difference when comparing first and second overlapping image data sets.

As shown in the data flow diagram of FIG. 10, combined variant images $1010_1$ and $1010_2$ (also labeled $CVI_{AQ1}$ and $CVI_{AQ2}$), are applied to respective edge-creating filters (e.g., a Sobel filter) in order to create "edge images" $1020_1$ and $1020_2$ that accentuate the edges of combined variant images $1010_1$ and $1010_2$. Additional edge-creating filters include, but are not limited to: Prewitt filters, Roberts filters, Standard deviation filters, Range filters, and Laplacian filters. Additionally, Canny edge detector can also be used to find the edges of an image.

The edge images $1020_1$ and $1020_2$ are then normalized to create normalized edge images (not shown) which are applied to a difference calculator 1030. The difference calculator generates a difference image 1040 that represents where the two combined variant images $1010_1$ and $1010_2$ differ. The magnitude of the difference signal can then be calculated. As should be understood, applying images that are exactly the same to the difference calculator would result in a difference image with zero intensity throughout the entire difference image.

Furthermore, the method calculates an edge image 1050 of the corresponding uniformly weighted image (e.g., also via the same filtering process that was applied to the variant images) which is normalized in a manner similar to the normalization of the edge images $1020_1$ and $1020_2$. The energy of the normalized uniform edge image is calculated, and the Energy of Edge Difference (EED) is calculated as the ratio of (a) the magnitude of the difference signal to (b) the magnitude of the normalized uniform edge image. If the EED is calculated to be above a specified threshold (e.g., empirically selected as 19.0 for the kind of spine imaging being used as the example herein), then substantial differences exist between the first and second overlapping image data sets, and the combined variant image with better image quality is selected as a final weighted overlapping combined image. Otherwise, the original uniformly weighted image can be used as the final weighted overlapping combined image. In one embodiment, the better/best variant is determined by finding out which variant has the least edge content. In one such embodiment, edge content is determined by calculating the total spatial variation for each variant, and the variant with the lowest total spatial variation is selected as the best variant as lower edge content generally corresponds to less motion artifact when evaluating different NAQ images.

In the exemplary images of FIG. 9, the EED was calculated to be 6.7 which is below the exemplary threshold of 19.0, thereby indicating that neither AQ1 nor AQ2 had significantly lower quality than the other. As such, in step 850, those images would have caused step 860 to be executed such that the original, uniformly combined image would be output as the final image instead of either variant ($CVI_{AQ1}$ or $CVI_{AQ2}$).

Figure 11:
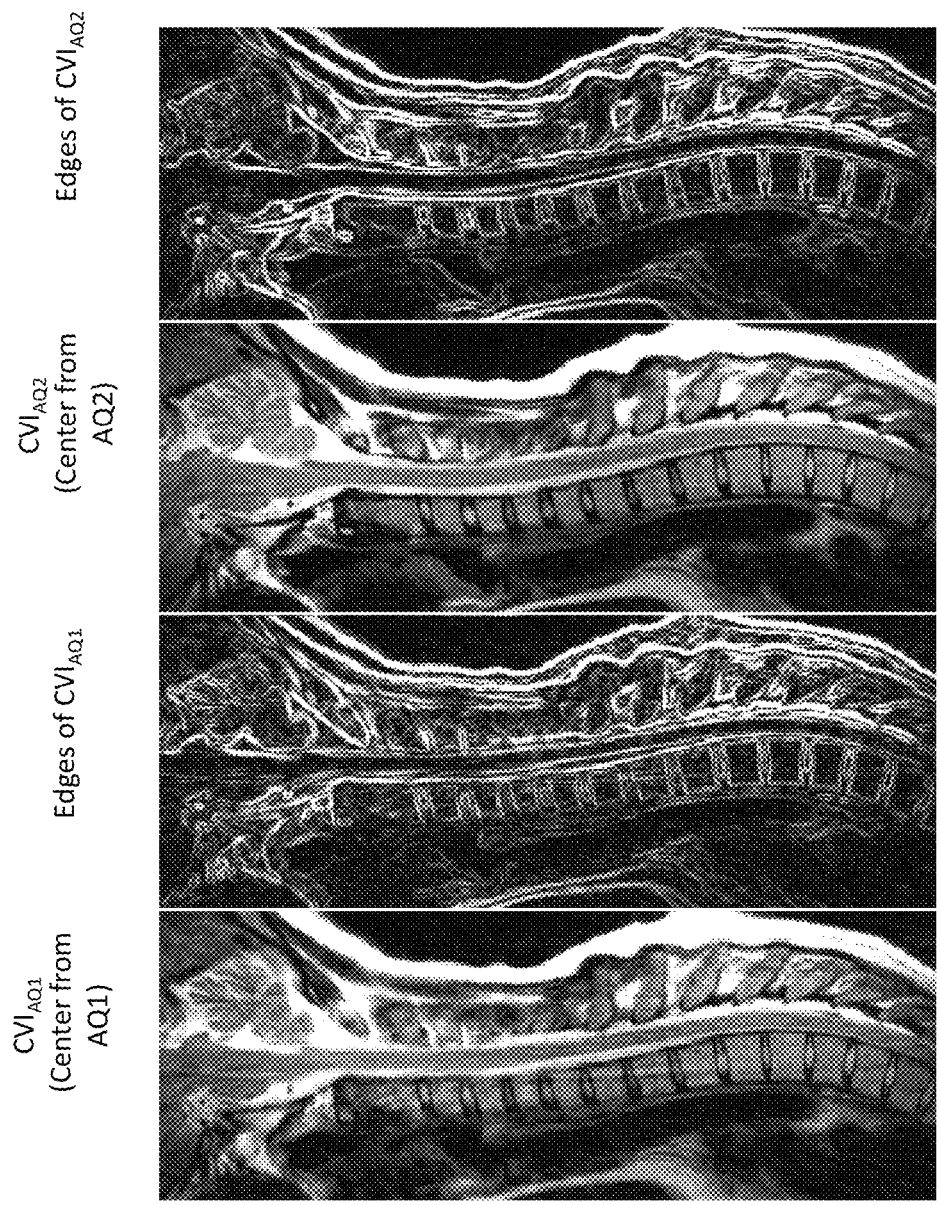
FIG. 11 is a second series of images showing a result of using the center portions of k-space representations of AQ1 and AQ2 separately to generate respective combined variant images and resulting calculated edges as part of an Energy of Edge Difference (EED).

By contrast, FIG. 11 is a second series of images also corresponding to the first option. In FIG. 11, combined variant images labeled $CVI_{AQ1}$ and $CVI_{AQ2}$, respectively, are shown illustrating an exemplary result of using the center portions of AQ1 and AQ2 separately to generate respective combined images (which are the left-most image and the image second from right, respectively) as described above with respect to step 830. Those images can then be used as part of an Energy of Edge Difference (EED) calculation to determine if the edge content of different variants is significantly different (indicating more motion or mis-registration—both of which can be corrected by the discussed technique). It also is possible to separately correct for mis-registration using a registration-specific technique and then correct for motion using the above-noted techniques.

In the exemplary images of FIG. 11, the EED was calculated to be 19.6 which is above a chosen threshold of 19.0, thereby indicating one of AQ1 and AQ2 had significantly lower quality than the other. As such, in step 850, those images would have caused step 870 to be executed to determine which of the two combined variant images had a lower artifact level. In this illustrative case, the combination using AQ2 as the center had a lower artifact level, and step 870 would output $CVA_{AQ2}$ as the combined image. One technique for determining which image has the lower artifact level is to calculate the total spatial variation for each variant, and the variant with the lowest total spatial variation was selected as the best variant. In general, based on empirical data, lower edge content generally corresponds to less motion artifact when evaluating the different NAQ images discussed herein.

Figure 12:
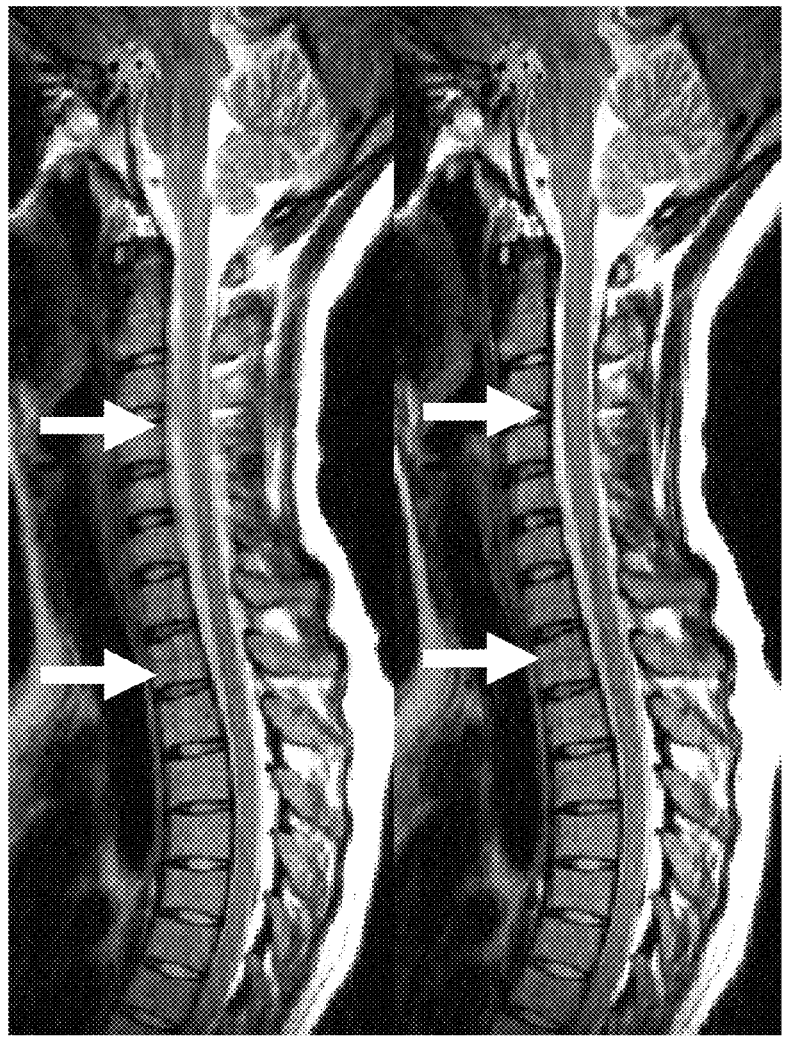
FIG. 12 is a set of comparative images showing the difference in image quality (e.g., motion artifacts) between a uniformly combined image and an image with weighted overlapping-image compensation.

FIG. 12 is a set of comparative images showing the difference in motion artifacts between a uniformly combined image and an image with weighted overlapping-image compensation using the images of FIG. 11. As can be seen in the right-hand image, the image generated using weighted overlapping-image compensation produces an image with reduced motion artifacts.

Figure 13B:
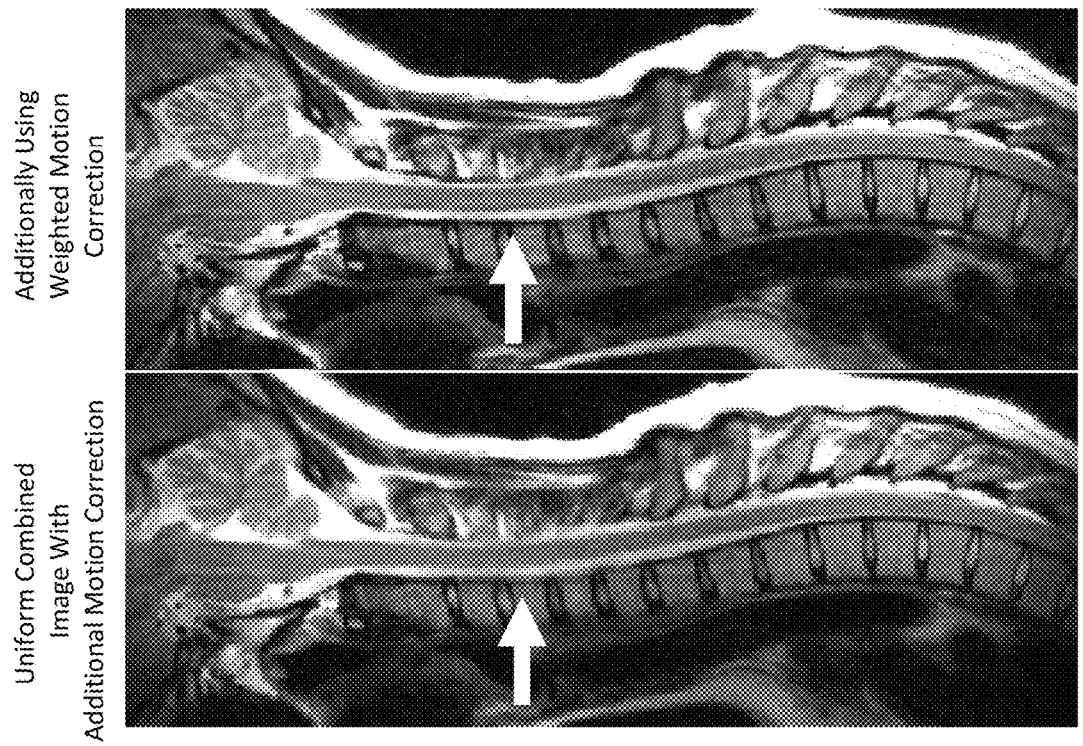
FIGS. 13A and 13B are a set of images showing an effect of using an optional image quality correction (e.g., motion correction) before using the weighted overlapping-image compensation described herein.
Figure 13A:
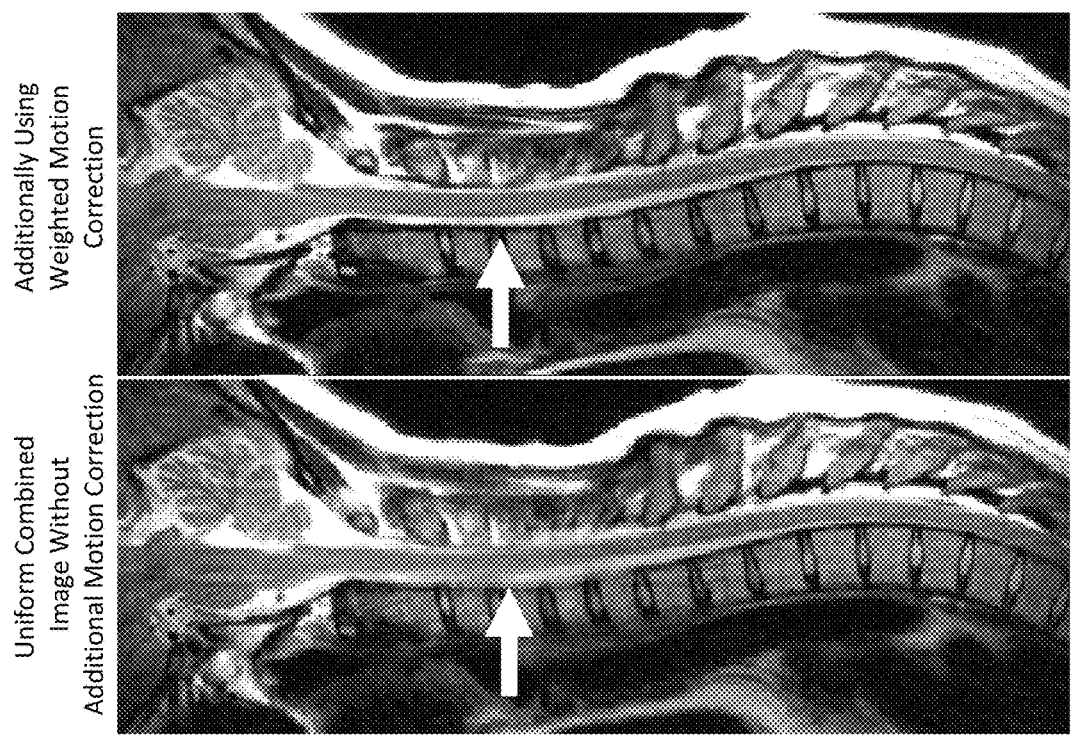

As noted above with respect to step 810 of FIG. 8A, it also is possible to use additional image processing techniques (or motion compensation techniques as shown in FIG. 8B) on the various acquired images before applying the weighted overlapping-image compensation techniques described herein. FIGS. 13A and 13B are a set of images showing an effect of using an optional motion correction before using the weighted overlapping-image compensation described herein. In FIGS. 13A and 13B, the right-hand images using weighted motion correction provide improved results over just using a known motion correction (selected as ID phase correction plus COCOA) in those figures.

Figures 14A, 14B, 14C:
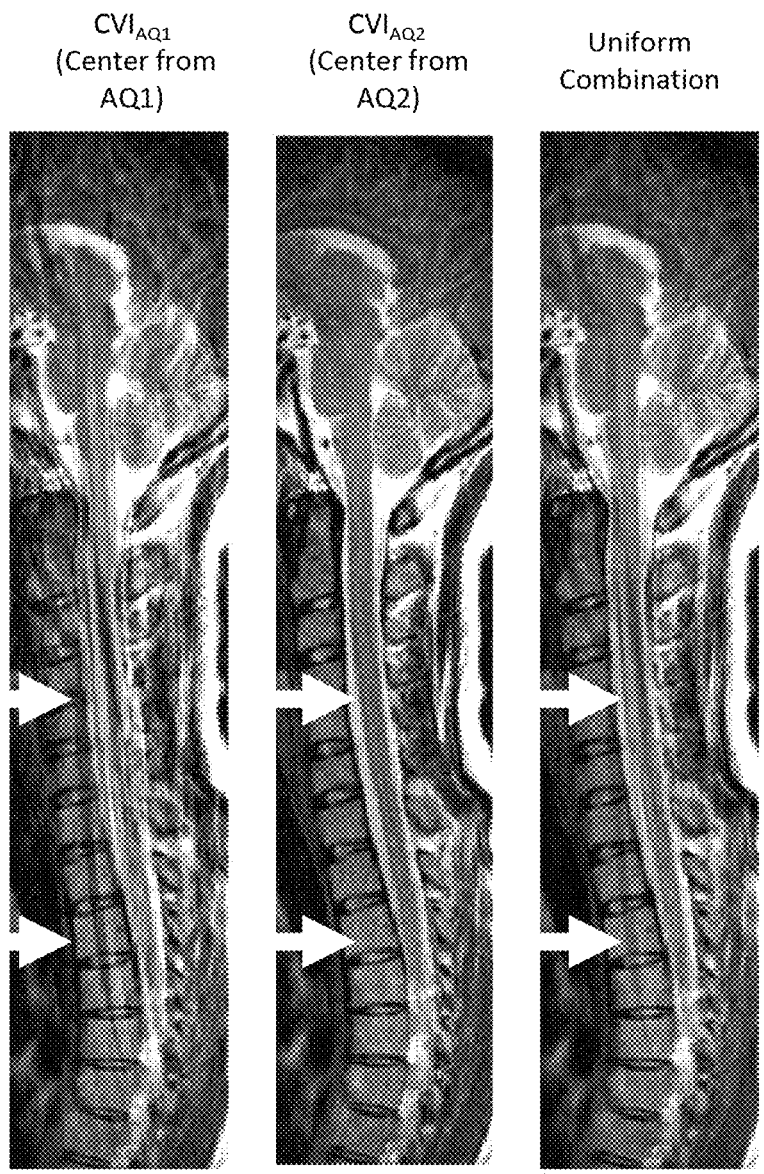
FIGS. 14A, 14B and 14C are a set of images showing various weighted overlapping combined images and a uniformly combined image for selection by a user.

FIGS. 14A, 14B and 14C are a set of images showing various weighted overlapping combined images and a uniformly combined image for selection by a user according to the second option of step 840 in FIG. 8B. In FIGS. 14A and 14B, combined variant images labeled $CVI_{AQ1}$ and $CVI_{AQ2}$, respectively, are shown illustrating an exemplary result of using the center portions of AQ1 and AQ2 separately to generate respective combined images (which are the left-most image and the image second from right, respectively) as described above with respect to step 830. Those images can be displayed to the user along with the uniformly combined image (FIG. 14C) to allow the user to select the most appropriate image (e.g., by selecting the corresponding image with a mouse, keyboard or touchscreen). One advantage to this option is that no global thresholding or additional processing is required to determine whether or not significant motion exist between different acquired images.

Figure 15:
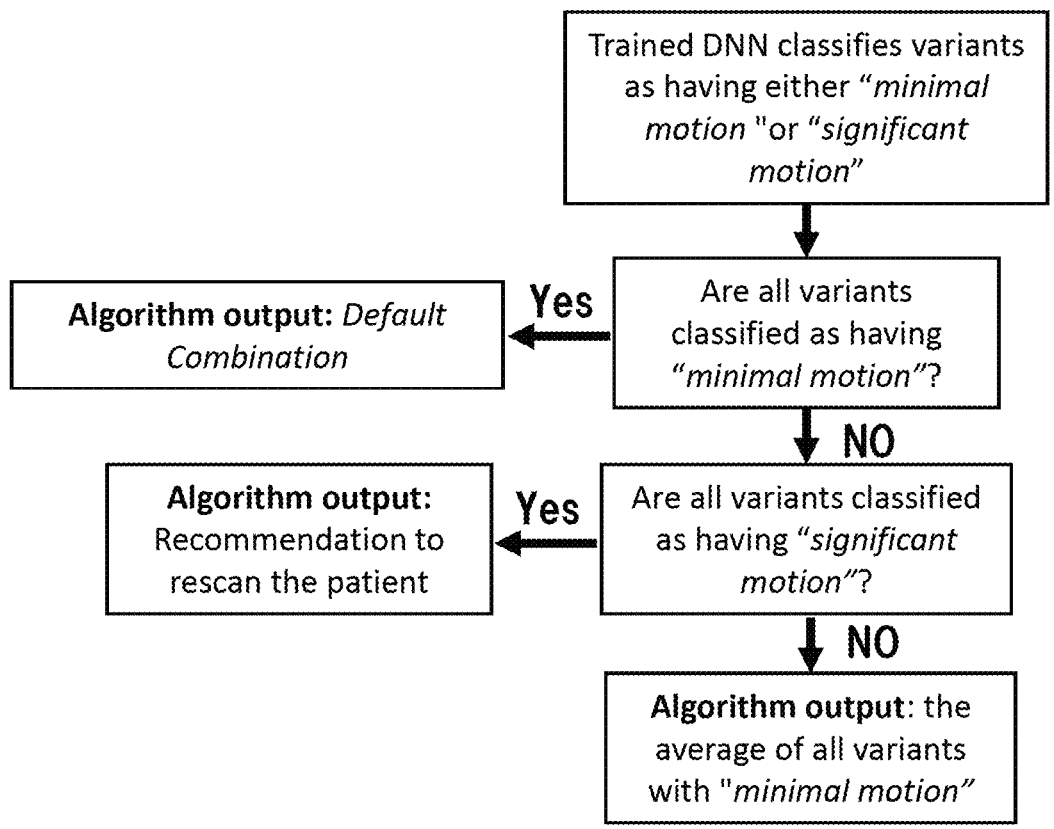
FIG. 15 is a flowchart showing a process of determining how to create a weighted modified image according to a third option.

According to the third option of step 840, at least one neural network can be used to determine if the weighted overlapping-image compensation should be utilized instead of a uniform combination. As shown in FIG. 15, a trained neural network (e.g., a deep neural network) can be trained to identify whether a particular variant has minimal motion or significant motion. If the trained neural network determines that all variants are classified as having "minimal motion," then processing can be performed as it is in the method 800 where processing goes from step 850 to step 860 and simply utilize the uniformly combined image. If instead all of the variants are not classified as having minimal motion, then the method of FIG. 15 performs a variant of FIG. 8B and determines if all the variants are classified as having significant motion. If so, then the system recommends rescanning the patient. Otherwise, weightings are assigned to those variants with "minimal motion" to produce a weighted overlapping combined image. In one such embodiment, the weightings are assigned equally as in FIG. 5 assuming that the variants associated with AQ2 and AQ3 were indicated as having minimal motion.

In an embodiment where a relative image quality measurement is known for the variants (e.g., first and second variants) having minimal motion, the weights need not be equal (e.g., a first weight may be 0.6 while a second weight may be 0.4, when a respective first variant corresponds to an image having less motion than an image corresponding to a second variant).

The methods and systems described herein can be implemented in a number of technologies but generally relate to imaging devices and processing circuitry for performing the processes described herein. In one embodiment, the processing circuitry (e.g., image processing circuitry and controller circuitry) is implemented as one of or as a combination of: an application specific integrated circuit (ASIC), a field programmable gate array (FPGA), a generic array of logic (GAL), a programmable array of logic (PAL), circuitry for allowing one-time programmability of logic gates (e.g., using fuses) or reprogrammable logic gates. Furthermore, the processing circuitry can include a computer processor and having embedded and/or external non-volatile computer readable memory (e.g., RAM, SRAM, FRAM, PROM, EPROM, and/or EEPROM) that stores computer instructions (binary executable instructions and/or interpreted computer instructions) for controlling the computer processor to perform the processes described herein. The computer processor circuitry may implement a single processor or multiprocessors, each supporting a single thread or multiple threads and each having a single core or multiple cores.

Obviously, numerous modifications and variations are possible in light of the above teachings. It is therefore to be understood that within the scope of the appended claims, embodiments of the present disclosure may be practiced otherwise than as specifically described herein.

Embodiments of the present disclosure may also be as set forth in the following parentheticals.

(1) An image processing method, including, but not limited to: acquiring first and second overlapping image data sets by performing first and second measurements on an overlapping location at first and second times, wherein the first and second times are different times; determining whether the first overlapping image data set and the second overlapping image data set have substantially a same image quality; generating and outputting a uniformly combined image using an equal weighting of the first and second overlapping image data sets when the first and second overlapping image data sets have substantially the same quality; generating and outputting, when the first overlapping image data set is determined to have a substantially higher image quality than the second overlapping image data set, a first weighted overlapping combined image by combining (a) first weighted image data generated by applying a first weight to an overlapping frequency range of the first overlapping image data set and (b) second weighted image data generated by applying a second weight to the overlapping frequency range of the second overlapping image data set; and generating and outputting, when the second overlapping image data set is determined to have a substantially higher image quality than the first overlapping image data set, a second weighted overlapping combined image by combining (a) third weighted image data generated by applying the first weight to an overlapping frequency range of the second overlapping image data set and (b) fourth weighted image data generated by applying the second weight to the overlapping frequency range of the first overlapping image data set, wherein the first weight is larger than the second weight.

(2) The imaging processing method of (1), wherein the first and second overlapping image data sets comprises first and second MRI data sets.

(3) The imaging processing method of (2), wherein the first and second MRI data sets comprise first and second k-space data sets, and the first and second weights comprise first and second k-space weights.

(4) The imaging processing method of any of (1) to (3), wherein determining whether the first overlapping image data set and the second overlapping image data set have substantially the same image quality includes, but is not limited to: generating the uniformly combined image using an equal weighting of the first and second overlapping image data sets; generating the first weighted overlapping combined image; generating the second weighted overlapping combined image; and determining, based on the uniformly combined image, the first weighted overlapping combined image, and the second weighted overlapping combined image, whether the first overlapping image data set and the second overlapping image data set have substantially the same image quality.

(5) The image processing method of (4), wherein determining, based on the uniformly combined image, the first weighted overlapping combined image, and the second weighted overlapping combined image, whether the first overlapping image data set and the second overlapping image data set have substantially the same image quality comprises determining, based on edges of each of the uniformly combined image, the first weighted overlapping combined image, and the second weighted overlapping combined image, whether the first overlapping image data set and the second overlapping image data set have substantially the same image quality.

(6) The imaging processing method of any of (1) to (5), wherein determining whether the first overlapping image data set and the second overlapping image data set have substantially the same image quality comprises using a neural network to determine, based on the uniformly combined image, the first weighted overlapping combined image, and the second weighted overlapping combined image, whether the first overlapping image data set and the second overlapping image data set have substantially the same image quality.

(7) The image processing method of any of (1) to (6), further comprising cropping the first and second overlapping image data sets to include only the overlapping location.

(8) The image processing method of any of (1) to (7), wherein determining whether the first overlapping image data set and the second overlapping image data set have substantially the same image quality comprises determining whether the first overlapping image data set and the second overlapping image data set have substantially a same amount of motion.

(9) The imaging processing method as claimed in claim 1, further including but not limited to: acquiring a third overlapping image data set by performing third measurements on an overlapping location at a third time different from the first and second times; and determining whether the first, second and third overlapping image data sets have substantially a same image quality, wherein generating and outputting the uniformly combined image comprises generating and outputting the uniformly combined image using an equal weighting of the first, second and third overlapping image data sets when the first, second and third overlapping image data sets have substantially the same quality; wherein generating and outputting the first weighted overlapping combined image comprises generating and outputting, when the first and third overlapping image data sets are determined to have a substantially higher image quality than the second overlapping image data set, the first weighted overlapping combined image by combining (a) first weighted image data generated by applying the first weight to the overlapping frequency range of the first and third overlapping image data sets and (b) second weighted image data generated by applying the second weight to the overlapping frequency range of the second overlapping image data set; and wherein generating and outputting the second weighted overlapping combined image comprises generating and outputting, when the second and third overlapping image data sets are determined to have a substantially higher image quality than the first overlapping image data set, the second weighted overlapping combined image by combining (a) third weighted image data generated by applying the first weight to an overlapping frequency range of the second and third overlapping image data sets and (b) fourth weighted image data generated by applying the second weight to the overlapping frequency range of the first overlapping image data set, the method further comprising generating and outputting, when the first and second overlapping image data sets are determined to have a substantially higher image quality than the third overlapping image data set, a third weighted overlapping combined image by combining (a) fifth weighted image data generated by applying the first weight to the overlapping frequency range of the first and second overlapping image data sets and (b) sixth weighted image data generated by applying the second weight to the overlapping frequency range of the third overlapping image data set.

(10) An image processing apparatus, including, but not limited to: processing circuitry configured to (a) acquire first and second overlapping image data sets by performing first and second measurements on an overlapping location at first and second times, wherein the first and second times are different times; (b) determine whether the first overlapping image data set and the second overlapping image data set have substantially a same image quality; (c) generate and output a uniformly combined image using an equal weighting of the first and second overlapping image data sets when the first and second overlapping image data sets have substantially the same quality; (d) generate and output, when the first overlapping image data set is determined to have a substantially higher image quality than the second overlapping image data set, a first weighted overlapping combined image by combining (a) first weighted image data generated by applying a first weight to an overlapping frequency range of the first overlapping image data set and (b) second weighted image data generated by applying a second weight to the overlapping frequency range of the second overlapping image data set; and (e) generate and output, when the second overlapping image data set is determined to have a substantially higher image quality than the first overlapping image data set, a second weighted overlapping combined image by combining (a) third weighted image data generated by applying the first weight to an overlapping frequency range of the second overlapping image data set and (b) fourth weighted image data generated by applying the second weight to the overlapping frequency range of the first overlapping image data set, wherein the first weight is larger than the second weight.

(11) The imaging processing apparatus of (10), wherein the first and second overlapping image data sets comprises first and second MRI data sets.

(12) The imaging processing apparatus of (10), wherein the first and second MRI data sets comprise first and second k-space data sets, and the first and second weights comprise first and second k-space weights.

(13) The imaging processing apparatus of any of (10) to (12), wherein the processing circuitry configured to determine whether the first overlapping image data set and the second overlapping image data set have substantially the same image quality includes, but is not limited to: processing circuitry configured to generate the uniformly combined image using an equal weighting of the first and second overlapping image data sets; generate the first weighted overlapping combined image; generate the second weighted overlapping combined image; and determine, based on the uniformly combined image, the first weighted overlapping combined image, and the second weighted overlapping combined image, whether the first overlapping image data set and the second overlapping image data set have substantially the same image quality.

(14) The image processing apparatus of (13), wherein the processing circuitry configured to determine, based on the uniformly combined image, the first weighted overlapping combined image, and the second weighted overlapping combined image, whether the first overlapping image data set and the second overlapping image data set have substantially the same image quality includes, but is not limited to, processing circuitry configured to determine, based on edges of each of the uniformly combined image, the first weighted overlapping combined image, and the second weighted overlapping combined image, whether the first overlapping image data set and the second overlapping image data set have substantially the same image quality.

(15) The imaging processing apparatus of any of (10) to (14), wherein the processing circuitry configured to determine whether the first overlapping image data set and the second overlapping image data set have substantially the same image quality includes but is not limited to, processing circuitry configured to use a neural network to determine, based on the uniformly combined image, the first weighted overlapping combined image, and the second weighted overlapping combined image, whether the first overlapping image data set and the second overlapping image data set have substantially the same image quality.

(16) The image processing apparatus of any of (10) to (15), further including, but not limited to, processing circuitry configured to crop the first and second overlapping image data sets to include only the overlapping location.

(17) The image processing apparatus of any of (10) to (16), wherein the processing circuitry configured to determine whether the first overlapping image data set and the second overlapping image data set have substantially the same image quality includes but is not limited to processing circuitry configured to determine whether the first overlapping image data set and the second overlapping image data set have substantially a same amount of motion.

(18) The imaging processing apparatus of any of (10) to (17), further including but not limited to: processing circuitry configured to acquire a third overlapping image data set by performing third measurements on an overlapping location at a third time different from the first and second times; and determine whether the first, second and third overlapping image data sets have substantially a same image quality, wherein the processing circuitry configured to generate and output the uniformly combined image includes but is not limited to processing circuitry configured to generate and output the uniformly combined image using an equal weighting of the first, second and third overlapping image data sets when the first, second and third overlapping image data sets have substantially the same quality; wherein the processing circuitry configured to generate and output the first weighted overlapping combined image includes but is not limited to processing circuitry configured to generate and output, when the first and third overlapping image data sets are determined to have a substantially higher image quality than the second overlapping image data set, the first weighted overlapping combined image by combining (a) first weighted image data generated by applying the first weight to the overlapping frequency range of the first and third overlapping image data sets and (b) second weighted image data generated by applying the second weight to the overlapping frequency range of the second overlapping image data set; and wherein the processing circuitry configured to generate and output the second weighted overlapping combined image includes but is not limited to processing circuitry configured to generate and output, when the second and third overlapping image data sets are determined to have a substantially higher image quality than the first overlapping image data set, the second weighted overlapping combined image by combining (a) third weighted image data generated by applying the first weight to an overlapping frequency range of the second and third overlapping image data sets and (b) fourth weighted image data generated by applying the second weight to the overlapping frequency range of the first overlapping image data set, the apparatus further comprising processing circuitry configured to generate and output, when the first and second overlapping image data sets are determined to have a substantially higher image quality than the third overlapping image data set, a third weighted overlapping combined image by combining (a) fifth weighted image data generated by applying the first weight to the overlapping frequency range of the first and second overlapping image data sets and (b) sixth weighted image data generated by applying the second weight to the overlapping frequency range of the third overlapping image data set.

(19) A non-transitory computer readable medium for use with a computer processor, the non-transitory computer readable medium comprising computer instructions for causing the computer processor, when the computer instructions are stored in a computer memory, to perform the steps of the methods of (1) to (9).

Thus, the foregoing discussion discloses and describes merely exemplary embodiments of the present disclosure. As will be understood by those skilled in the art, the present disclosure may be embodied in other specific forms without departing from the spirit thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

The invention claimed is:

1. An imaging processing method comprising:
   acquiring first and second overlapping image data sets by performing first and second measurements on an overlapping location at first and second times, wherein the first and second times are different times;
   determining whether the first overlapping image data set and the second overlapping image data set have substantially a same image quality;
   generating and outputting a uniformly combined image using an equal weighting of the first and second overlapping image data sets when the first and second overlapping image data sets have substantially the same quality;
   generating and outputting, when the first overlapping image data set is determined to have a substantially higher image quality than the second overlapping image data set, a first weighted overlapping combined image by combining (a) first weighted image data generated by applying a first weight to an overlapping frequency range of the first overlapping image data set and (b) second weighted image data generated by applying a second weight to the overlapping frequency range of the second overlapping image data set; and
   generating and outputting, when the second overlapping image data set is determined to have a substantially higher image quality than the first overlapping image data set, a second weighted overlapping combined image by combining (a) third weighted image data generated by applying the first weight to an overlapping frequency range of the second overlapping image data set and (b) fourth weighted image data generated by applying the second weight to the overlapping frequency range of the first overlapping image data set,
   wherein the first weight is larger than the second weight.

2. The imaging processing method as claimed in claim 1, wherein the first and second overlapping image data sets comprises first and second MRI data sets.

3. The imaging processing method as claimed in claim 2, wherein the first and second MRI data sets comprise first and second k-space data sets, and the first and second weights comprise first and second k-space weights.

4. The imaging processing method as claimed in claim 1, wherein determining whether the first overlapping image data set and the second overlapping image data set have substantially the same image quality comprises:
   generating the uniformly combined image using an equal weighting of the first and second overlapping image data sets;
   generating the first weighted overlapping combined image;
   generating the second weighted overlapping combined image; and
   determining, based on the uniformly combined image, the first weighted overlapping combined image, and the second weighted overlapping combined image, whether the first overlapping image data set and the second overlapping image data set have substantially the same image quality.

5. The image processing method as claimed in claim 4, wherein determining, based on the uniformly combined image, the first weighted overlapping combined image, and the second weighted overlapping combined image, whether the first overlapping image data set and the second overlapping image data set have substantially the same image quality comprises determining, based on edges of each of the uniformly combined image, the first weighted overlapping combined image, and the second weighted overlapping combined image, whether the first overlapping image data set and the second overlapping image data set have substantially the same image quality.

6. The imaging processing method as claimed in claim 1, wherein determining whether the first overlapping image data set and the second overlapping image data set have substantially the same image quality comprises using a neural network to determine, based on the uniformly combined image, the first weighted overlapping combined image, and the second weighted overlapping combined image, whether the first overlapping image data set and the second overlapping image data set have substantially the same image quality.

7. The image processing method as claimed in claim 1, further comprising cropping the first and second overlapping image data sets to include only the overlapping location.

8. The image processing method as claimed in claim 1, wherein determining whether the first overlapping image data set and the second overlapping image data set have substantially the same image quality comprises determining whether the first overlapping image data set and the second overlapping image data set have substantially a same amount of motion.

9. The imaging processing method as claimed in claim 1, further comprising:
acquiring a third overlapping image data set by performing third measurements on an overlapping location at a third time different from the first and second times; and
determining whether the first, second and third overlapping image data sets have substantially a same image quality,
wherein generating and outputting the uniformly combined image comprises generating and outputting the uniformly combined image using an equal weighting of the first, second and third overlapping image data sets when the first, second and third overlapping image data sets have substantially the same quality;
wherein generating and outputting the first weighted overlapping combined image comprises generating and outputting, when the first and third overlapping image data sets are determined to have a substantially higher image quality than the second overlapping image data set, the first weighted overlapping combined image by combining (a) first weighted image data generated by applying the first weight to the overlapping frequency range of the first and third overlapping image data sets and (b) second weighted image data generated by applying the second weight to the overlapping frequency range of the second overlapping image data set; and
wherein generating and outputting the second weighted overlapping combined image comprises generating and outputting, when the second and third overlapping image data sets are determined to have a substantially higher image quality than the first overlapping image data set, the second weighted overlapping combined image by combining (a) third weighted image data generated by applying the first weight to an overlapping frequency range of the second and third overlapping image data sets and (b) fourth weighted image data generated by applying the second weight to the overlapping frequency range of the first overlapping image data set,
the method further comprising generating and outputting, when the first and second overlapping image data sets are determined to have a substantially higher image quality than the third overlapping image data set, a third weighted overlapping combined image by combining (a) fifth weighted image data generated by applying the first weight to the overlapping frequency range of the first and second overlapping image data sets and (b) sixth weighted image data generated by applying the second weight to the overlapping frequency range of the third overlapping image data set.

10. An image processing apparatus comprising:
processing circuitry configured to
acquire first and second overlapping image data sets by performing first and second measurements on an overlapping location at first and second times, wherein the first and second times are different times;
determine whether the first overlapping image data set and the second overlapping image data set have substantially a same image quality;
generate and output a uniformly combined image using an equal weighting of the first and second overlapping image data sets when the first and second overlapping image data sets have substantially the same quality;
generate and output, when the first overlapping image data set is determined to have a substantially higher image quality than the second overlapping image data set, a first weighted overlapping combined image by combining (a) first weighted image data generated by applying a first weight to an overlapping frequency range of the first overlapping image data set and (b) second weighted image data generated by applying a second weight to the overlapping frequency range of the second overlapping image data set; and
generate and output, when the second overlapping image data set is determined to have a substantially higher image quality than the first overlapping image data set, a second weighted overlapping combined image by combining (a) third weighted image data generated by applying the first weight to an overlapping frequency range of the second overlapping image data set and (b) fourth weighted image data generated by applying the second weight to the overlapping frequency range of the first overlapping image data set, wherein the first weight is larger than the second weight.

11. The imaging processing apparatus of claim 10, wherein the first and second overlapping image data sets comprises first and second MRI data sets.

12. The imaging processing apparatus of claim 11, wherein the first and second MRI data sets comprise first and second k-space data sets, and the first and second weights comprise first and second k-space weights.

13. The imaging processing apparatus of claim 10, wherein the processing circuitry is configured to determine whether the first overlapping image data set and the second overlapping image data set have substantially the same image quality by
generating the uniformly combined image using an equal weighting of the first and second overlapping image data sets;
generating the first weighted overlapping combined image;
generating the second weighted overlapping combined image; and
determining, based on the uniformly combined image, the first weighted overlapping combined image, and the second weighted overlapping combined image, whether the first overlapping image data set and the second overlapping image data set have substantially the same image quality.

14. The image processing apparatus of claim 13, wherein the processing circuitry is configured to determine, based on the uniformly combined image, the first weighted overlapping combined image, and the second weighted overlapping combined image, whether the first overlapping image data set and the second overlapping image data set have substantially the same image quality by determining, based on edges of each of the uniformly combined image, the first weighted overlapping combined image, and the second weighted overlapping combined image, whether the first overlapping image data set and the second overlapping image data set have substantially the same image quality.

15. The imaging processing apparatus of claim 10, wherein the processing circuitry is configured to determine whether the first overlapping image data set and the second overlapping image data set have substantially the same image quality by using a neural network to determine, based on the uniformly combined image, the first weighted overlapping combined image, and the second weighted overlapping combined image, whether the first overlapping image data set and the second overlapping image data set have substantially the same image quality.

16. The image processing apparatus of claim 10, wherein the processing circuitry is configured to determine whether the first overlapping image data set and the second overlapping image data set have substantially the same image quality by determining whether the first overlapping image data set and the second overlapping image data set have substantially a same amount of motion.

17. The imaging processing apparatus of claim 10, wherein the processing circuitry is configured to:
    acquire a third overlapping image data set by performing third measurements on an overlapping location at a third time different from the first and second times; and
    determine whether the first, second and third overlapping image data sets have substantially a same image quality,
    wherein the processing circuitry is configured to generate and output the uniformly combined image by generating and outputting the uniformly combined image using an equal weighting of the first, second and third overlapping image data sets when the first, second and third overlapping image data sets have substantially the same quality;
    wherein the processing circuitry is configured to generate and output the first weighted overlapping combined image by generating and outputting, when the first and third overlapping image data sets are determined to have a substantially higher image quality than the second overlapping image data set, the first weighted overlapping combined image by combining (a) first weighted image data generated by applying the first weight to the overlapping frequency range of the first and third overlapping image data sets and (b) second weighted image data generated by applying the second weight to the overlapping frequency range of the second overlapping image data set;
    wherein the processing circuitry is configured to generate and output the second weighted overlapping combined image by generating and outputting, when the second and third overlapping image data sets are determined to have a substantially higher image quality than the first overlapping image data set, the second weighted overlapping combined image by combining (a) third weighted image data generated by applying the first weight to an overlapping frequency range of the second and third overlapping image data sets and (b) fourth weighted image data generated by applying the second weight to the overlapping frequency range of the first overlapping image data set; and
    wherein the processing circuitry is configured to generate and output, when the first and second overlapping image data sets are determined to have a substantially higher image quality than the third overlapping image data set, a third weighted overlapping combined image by combining (a) fifth weighted image data generated by applying the first weight to the overlapping frequency range of the first and second overlapping image data sets and (b) sixth weighted image data generated by applying the second weight to the overlapping frequency range of the third overlapping image data set.

18. A non-transitory computer readable medium for use with a computer processor, the non-transitory computer readable medium storing computer instructions that, when executed by the computer processor, cause the computer processor to perform:
    acquiring first and second overlapping image data sets by performing first and second measurements on an overlapping location at first and second times, wherein the first and second times are different times;
    determining whether the first overlapping image data set and the second overlapping image data set have substantially a same image quality;
    generating and outputting a uniformly combined image using an equal weighting of the first and second overlapping image data sets when the first and second overlapping image data sets have substantially the same quality;
    generating and outputting, when the first overlapping image data set is determined to have a substantially higher image quality than the second overlapping image data set, a first weighted overlapping combined image by combining (a) first weighted image data generated by applying a first weight to an overlapping frequency range of the first overlapping image data set and (b) second weighted image data generated by applying a second weight to the overlapping frequency range of the second overlapping image data set; and
    generating and outputting, when the second overlapping image data set is determined to have a substantially higher image quality than the first overlapping image data set, a second weighted overlapping combined image by combining (a) third weighted image data generated by applying the first weight to an overlapping frequency range of the second overlapping image data set and (b) fourth weighted image data generated by applying the second weight to the overlapping frequency range of the first overlapping image data set,
    wherein the first weight is larger than the second weight.

19. The non-transitory computer readable medium as claimed in claim 18, wherein the first and second overlapping image data sets comprises first and second MRI data sets.

20. The non-transitory computer readable medium as claimed in claim 19, wherein the first and second MRI data sets comprise first and second k-space data sets, and the first and second weights comprise first and second k-space weights.

* * * * *